(12) United States Patent
Song et al.

(10) Patent No.: US 12,148,489 B2
(45) Date of Patent: Nov. 19, 2024

(54) EARLY DETECTION OF PROGRAMMING FAILURE FOR NON-VOLATILE MEMORY

(71) Applicant: SanDisk Technologies LLC, Addison, TX (US)

(72) Inventors: Yi Song, San Jose, CA (US); Sarath Puthenthermadam, San Jose, CA (US); Jiahui Yuan, Fremont, CA (US)

(73) Assignee: SanDisk Technologies LLC, Austin, TX (US)

( * ) Notice: Subject to any disclaimer, the term of this patent is extended or adjusted under 35 U.S.C. 154(b) by 273 days.

(21) Appl. No.: 17/874,014

(22) Filed: Jul. 26, 2022

(65) Prior Publication Data

US 2024/0038315 A1    Feb. 1, 2024

(51) Int. Cl.
| | |
|---|---|
| *G11C 29/12* | (2006.01) |
| *G11C 11/408* | (2006.01) |
| *G11C 16/08* | (2006.01) |
| *G11C 16/26* | (2006.01) |
| *G11C 16/34* | (2006.01) |
| *G11C 16/04* | (2006.01) |

(52) U.S. Cl.
CPC .... *G11C 29/12005* (2013.01); *G11C 11/4085* (2013.01); *G11C 16/08* (2013.01); *G11C 16/26* (2013.01); *G11C 16/3454* (2013.01); *G11C 16/0483* (2013.01); *G11C 2029/1202* (2013.01)

(58) Field of Classification Search
CPC .......... G11C 29/12005; G11C 11/4085; G11C 16/08; G11C 16/26; G11C 16/3454; G11C 16/0483; G11C 2029/1202; G11C 11/5671; G11C 29/52; G11C 2029/0411; G11C 11/5628; G11C 16/10; G11C 16/3459

USPC ....................................................... 365/185.11
See application file for complete search history.

(56) References Cited

U.S. PATENT DOCUMENTS

| | | | |
|---|---|---|---|
| 10,249,382 B2 | 4/2019 | Lee et al. | |
| 10,665,313 B1 * | 5/2020 | Lu ...................... | G11C 16/3404 |
| 11,282,570 B2 | 3/2022 | Hong | |
| 2012/0106247 A1 | 5/2012 | Shin | |
| 2016/0148695 A1 | 5/2016 | Kim | |
| 2018/0075918 A1 | 3/2018 | Kim et al. | |
| 2019/0006016 A1 * | 1/2019 | Khakifirooz ............. | G11C 8/10 |
| 2019/0066781 A1 * | 2/2019 | Rajamohanan ........ | H10B 63/34 |
| 2021/0166771 A1 * | 6/2021 | Jung ...................... | G11C 16/10 |
| 2021/0280241 A1 | 9/2021 | Choi | |
| 2023/0023618 A1 * | 1/2023 | Zhang ..................... | G11C 16/30 |
| 2023/0290412 A1 * | 9/2023 | Choi ...................... | G11C 16/10 |
| 2024/0028216 A1 * | 1/2024 | Choi ..................... | G06F 3/0679 |

* cited by examiner

*Primary Examiner* — Fernando Hidalgo
(74) *Attorney, Agent, or Firm* — Vierra Magen Marcus LLP

(57) ABSTRACT

An apparatus is provided that includes a block including a word line coupled to a plurality of memory cells, and a control circuit coupled to the word line. The control circuit is configured to program the plurality of memory cells by applying program pulses to the word line in a plurality of program loops, determining a first count of a number of the program loops used to complete programming a first subset of the plurality of memory cells to a first programmed state, first comparing the first count to a corresponding first lower limit and a corresponding first upper limit, and determining whether programming the plurality of memory cells has failed based on a result of the first comparing step.

20 Claims, 16 Drawing Sheets number of cells

$V_T$ number of cells

E    IM $V_{vIM}$

Fig. 7B

$V_T$ number of cells

$V_T$ number of cells

$V_T$ number of cells

EARLY DETECTION OF PROGRAMMING FAILURE FOR NON-VOLATILE MEMORY

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device (or other client). However, various challenges are presented in operating such memory systems. In particular, as memory cells decrease in size and memory arrays increase in density, maintaining the integrity of data being stored becomes more challenging.

BRIEF DESCRIPTION OF THE DRAWINGS

Like-numbered elements refer to common components in the different figures.

FIGS. 7A-7E depict various threshold voltage distributions and describe a process for programming non-volatile memory.

DETAILED DESCRIPTION

Technology is described for programming processes that include early detection of programming failure, word line failure and/or block failure. In particular, programming processes that include early detection of programming failure, word line failure and/or block failure based on detecting a deviation in program completion loops for non-volatile memory.

Some non-volatile memory devices are used to store two ranges of charges and, therefore, the memory cells can be programmed/erased between two data states: an erased state and a programmed state (corresponding to data "1" and data "0"). Such a device is referred to as a binary device or a single-level cell (SLC) and the data are binary data.

In contrast, a multi-state flash memory cell (storing multi-state data) is implemented by identifying multiple, distinct allowed threshold voltage ranges. Each distinct threshold voltage range corresponds to a predetermined value for the set of data bits. For example, some memory cells can store two or more bits. The specific relationship between the data programmed into the memory cell and the threshold voltage ranges of the memory cell depends upon the data encoding scheme adopted for the memory cells.

In addition to the gains in capacity resulting from multi-state memory architectures, significant advantages in memory technology have resulted from steadily scaling down the physical dimensions of memory cells. Smaller memory cells can be packed more densely on a given die area, allowing higher memory capacity for the same price as an older memory technology.

Figure 1:
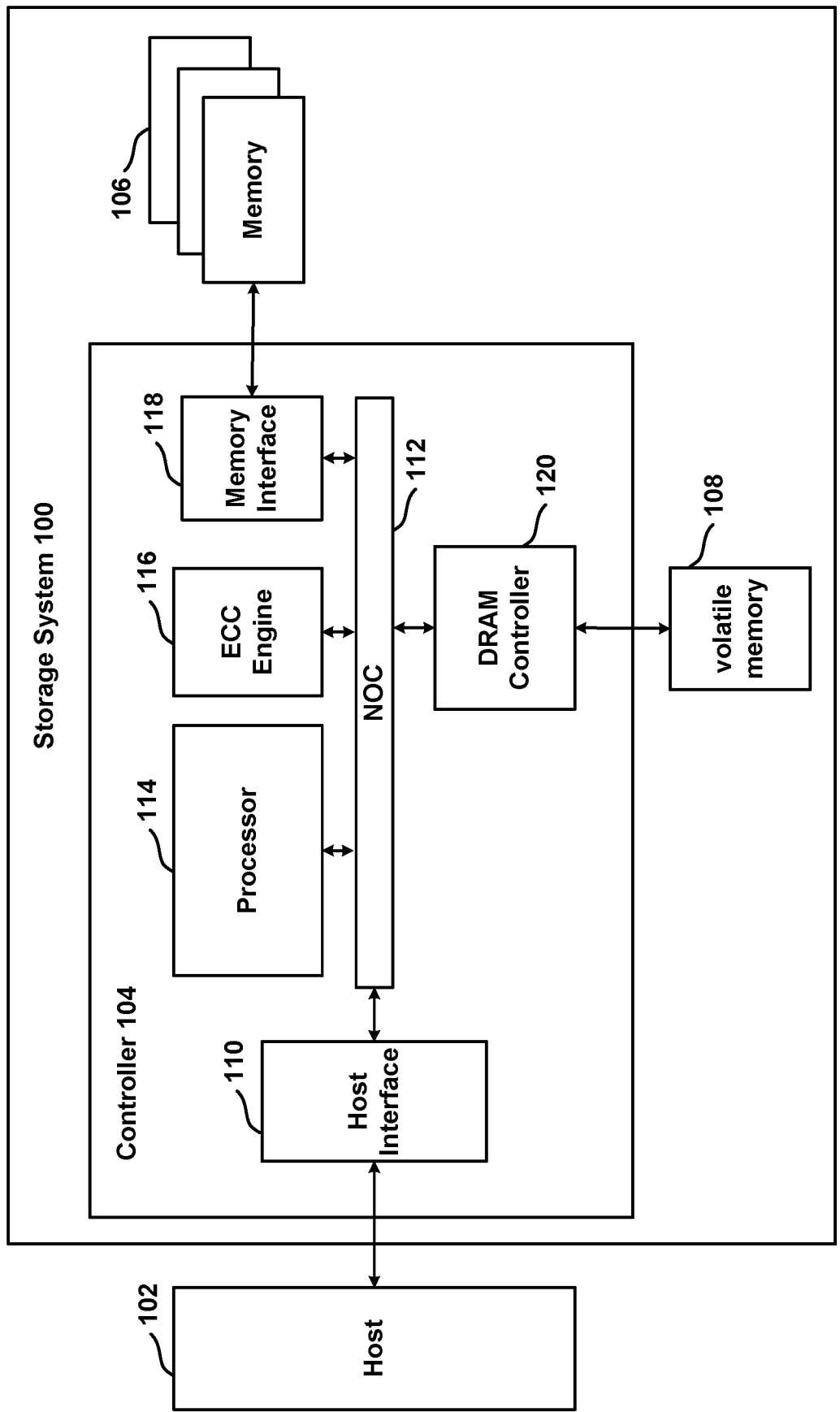
FIG. 1 is a block diagram depicting one embodiment of a memory system.

FIG. 1 is a block diagram of an embodiment of a memory system 100 that implements the described technology. In an embodiment, memory system 100 is a solid state drive ("SSD"). Memory system 100 also can be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 104 connected to one or more memory die 106 and local high speed volatile memory 108 (e.g., DRAM). The one or more memory die 106 each include a plurality of non-volatile memory cells. More information about the structure of each memory die 106 is provided below. Local high speed volatile memory 108 is used by controller 104 to perform certain functions. For example, local high speed volatile memory 108 stores logical to physical address translation tables ("L2P tables")

Controller 104 includes a host interface 110 that is connected to and in communication with host 102. In one embodiment, host interface 110 provides a PCIe interface. Other interfaces can also be used, such as SCSI, SATA, etc. Host interface 110 is also connected to a network-on-chip (NOC) 112, which is a communication subsystem on an integrated circuit. In other embodiments, NOC 112 can be replaced by a bus.

A NOC can span synchronous and asynchronous clock domains or use un-clocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. In embodiments, the wires and the links of a NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges).

Connected to and in communication with NOC 112 is processor 114, ECC engine 116, memory interface 118, and DRAM controller 120. DRAM controller 120 is used to operate and communicate with local high speed volatile memory 108 (e.g., DRAM). In other embodiments, local high speed volatile memory 108 can be SRAM or another type of volatile memory.

ECC engine 116 performs error correction services. For example, ECC engine 116 performs data encoding and decoding, as per the implemented ECC technique. In one embodiment, ECC engine 116 is an electrical circuit programmed by software. For example, ECC engine 116 can be a processor that can be programmed. In other embodiments, ECC engine 116 is a custom and dedicated hardware circuit without any software. In another embodiment, the function of ECC engine 116 is implemented by processor 114.

Processor 114 performs the various controller memory operations, such as programming, erasing, reading, as well as memory management processes. In an embodiment, processor 114 is programmed by firmware. In other embodiments, processor 114 is a custom and dedicated hardware circuit without any software. In an embodiment, processor 114 also implements a translation module, as a software/firmware process or as a dedicated hardware circuit.

In many systems, non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To enable this system, the controller (e.g., the translation module) performs address translation between the logical addresses used by the host and the physical addresses used by the memory dies.

One example implementation is to maintain tables (e.g., the L2P tables mentioned above) that identify a translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure.

In some examples, the memory space of a storage system is so large that local memory 108 cannot hold all of the L2P tables. In such a case, the entire set of L2P tables are stored in a memory die 106 and a subset of the L2P tables are cached (L2P cache) in the local high speed volatile memory 108.

In an embodiment, memory interface 118 communicates with one or more memory die 106. In an embodiment, memory interface 118 provides a Toggle Mode interface. Other interfaces also can be used. In some example implementations, memory interface 118 (or another portion of controller 104) implements a scheduler and buffer for transmitting data to and receiving data from one or more memory die.

Figure 2:
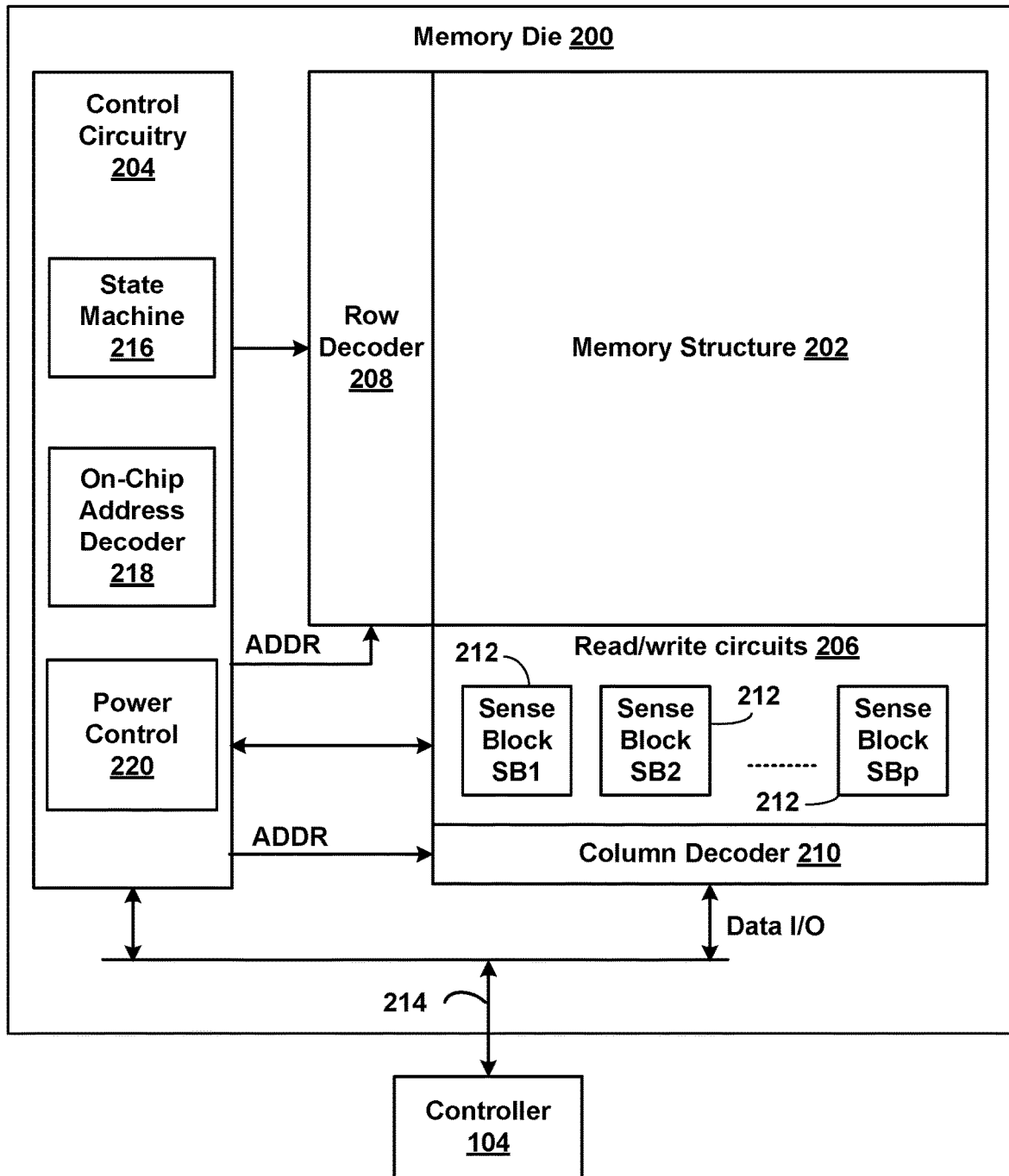
FIG. 2 is a block diagram of one embodiment of a memory die.

FIG. 2 is a functional block diagram of one embodiment of a memory die 200. Each of the one or more memory die 106 of FIG. 1 can be implemented as memory die 200 of FIG. 2. The components depicted in FIG. 2 are electrical circuits. In an embodiment, each memory die 200 includes a memory structure 202, control circuitry 204, and read/write circuits 206. Memory structure 202 is addressable by word lines via a row decoder 208 and by bit lines via a column decoder 210.

In an embodiment, read/write circuits 206 include multiple sense blocks 212 including SB1, SB2, . . . SBp (sensing circuitry) and allow a page (or multiple pages) of data in multiple memory cells to be read or programmed (written) in parallel. In an embodiment, each sense block 212 include a sense amplifier and a set of latches connected to the bit line. The latches store data to be written and/or data that has been read. In an embodiment, each sense amplifier 212 includes bit line drivers. In an embodiment, commands and data are transferred between controller 104 and memory die 200 via lines 214. In an embodiment, memory die 200 includes a set of input and/or output (I/O) pins that connect to lines 214.

In an embodiment, control circuitry 204 cooperates with read/write circuits 206 to perform memory operations (e.g., write, read, erase, and others) on memory structure 202. In an embodiment, control circuitry 204 includes a state machine 216, an on-chip address decoder 218, and a power control circuit 220. In an embodiment, state machine 216 provides die-level control of memory operations. In an embodiment, state machine 216 is programmable by software. In other embodiments, state machine 216 does not use software and is completely implemented in hardware (e.g., electrical circuits). In some embodiments, state machine 216 can be replaced by a microcontroller or microprocessor. In an embodiment, control circuitry 204 includes buffers such as registers, ROM fuses and other storage devices for storing default values such as base voltages and other parameters.

On-chip address decoder 218 provides an address interface between addresses used by controller 104 to the hardware address used by row decoder 208 and column decoder 210. Power control module 220 controls the power and voltages supplied to the word lines and bit lines during memory operations. Power control module 220 may include charge pumps for creating voltages.

For purposes of this document, control circuitry 204, read/write circuits 206, row decoder 208 and column decoder 210 comprise a "Control Circuit" for memory structure 202. In other embodiments, other circuits that support and operate on memory structure 202 can be referred to as a Control Circuit. For example, in some embodiments, controller 104 can operate as the Control Circuit or can be part of the Control Circuit. The Control Circuit also can be implemented as a microprocessor or other type of processor that is hardwired or programmed to perform the functions described herein.

For purposes of this document, control circuitry 204, read/write circuits 206, row decoder 208 and column decoder 210 comprise peripheral circuits for memory structure 202, as they are not part of memory structure 202 but are on the same die as memory structure 202 and are used to operate memory structure 202.

In an embodiment, memory structure 202 is a three dimensional memory array of non-volatile memory cells. In an embodiment, memory structure 202 is a monolithic three dimensional memory array in which multiple memory levels are formed above a single substrate, such as a wafer. The memory structure may be any type of non-volatile memory that is formed in one or more physical levels of arrays of memory cells having an active area disposed above a silicon (or other type of) substrate. In one example, the non-volatile memory cells of memory structure 202 include vertical NAND strings with charge-trapping material such as described. A NAND string includes memory cells connected by a channel.

In another embodiment, memory structure 202 includes a two dimensional memory array of non-volatile memory cells. In an example, the non-volatile memory cells are NAND flash memory cells utilizing floating gates. Other types of memory cells (e.g., NOR-type flash memory) also can be used.

The exact type of memory array architecture or memory cell included in memory structure 202 is not limited to the examples above. Many different types of memory array architectures or memory cell technologies can be used to form memory structure 202. No particular non-volatile memory technology is required for purposes of the new technology described herein.

Other examples of suitable technologies for memory cells of the memory structure 202 include ReRAM memories, magnetoresistive memory (MRAM), phase change memory (PCM), and the like. Examples of suitable technologies for architectures of memory structure 202 include two dimensional arrays, three dimensional arrays, cross-point arrays, stacked two dimensional arrays, vertical bit line arrays, and the like.

One example of a cross point memory includes reversible resistance-switching elements arranged in cross point arrays accessed by X lines and Y lines (e.g., word lines and bit lines). In another embodiment, the memory cells may include conductive bridge memory elements. A conductive bridge memory element also may be referred to as a programmable metallization cell.

A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of solid electrolyte between the two electrodes.

MRAM stores data using magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—$Sb_2Te_3$ super lattice to achieve non-thermal phase changes by simply changing the coordination state of Germanium atoms with a laser pulse (or light pulse from another source). Therefore, the doses of programming are laser pulses. The memory cells can be inhibited from programming by blocking the memory cells from receiving the light.

A person of ordinary skill in the art will recognize that the technology described herein is not limited to a single specific memory structure, but covers many relevant memory structures within the scope of the technology as described herein and as understood by one of ordinary skill in the art.

Figure 3:
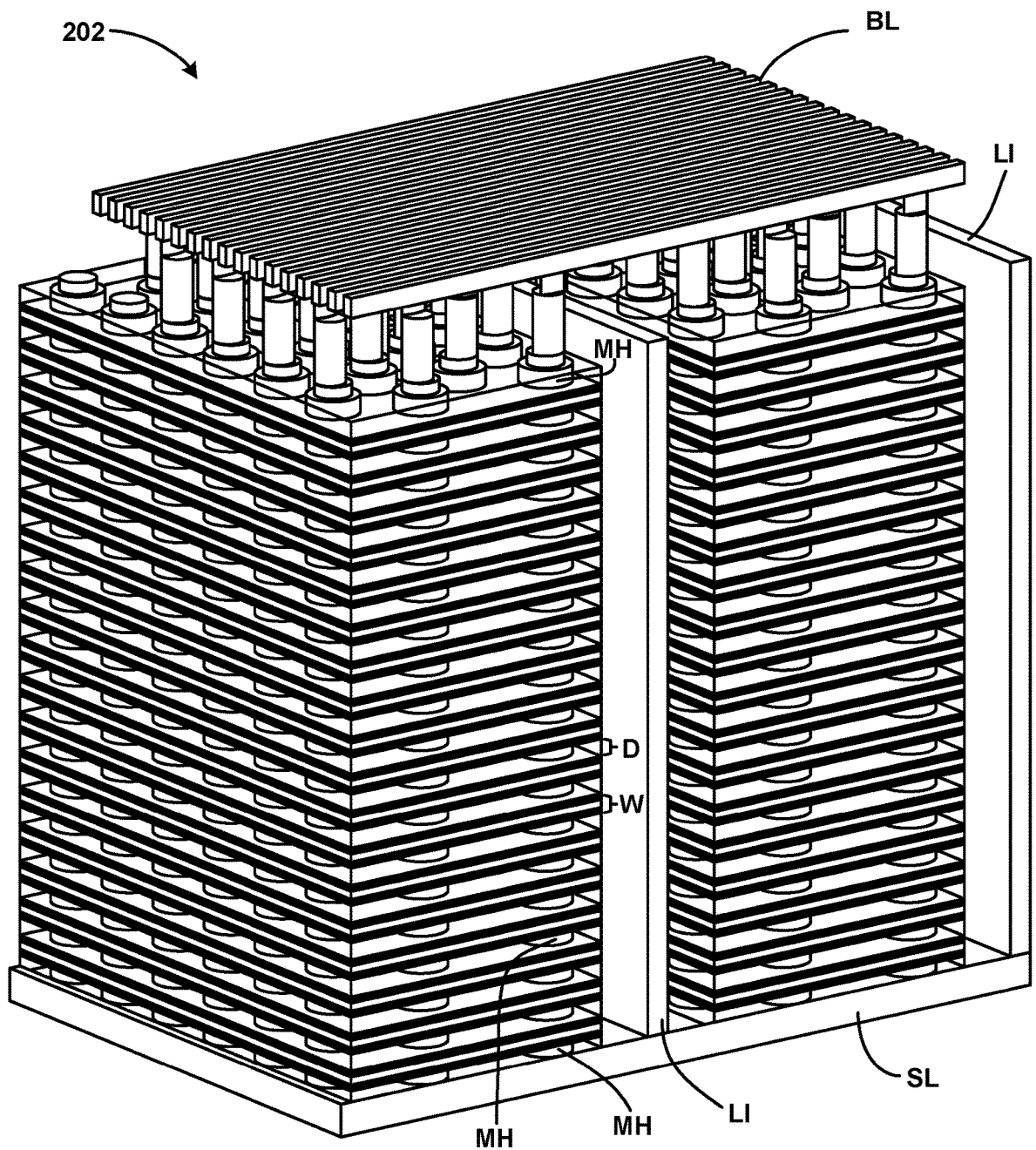
FIG. 3 is a perspective view of a portion of one embodiment of a three dimensional memory structure.

FIG. 3 is a perspective view of a portion of an embodiment of a three dimensional memory array that includes memory structure 202. In an embodiment, memory structure 202 includes multiple non-volatile memory cells. For example, FIG. 3 shows a portion of one block of memory cells. The structure depicted includes a set of bit lines BL positioned above a stack of alternating dielectric layers and conductive layers. For example purposes, one of the dielectric layers is marked as D and one of the conductive layers (also called word line layers) is marked as W.

The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers also can be used. In an embodiment, the alternating dielectric layers and conductive layers are divided into four regions by local interconnects LI. FIG. 3 shows two regions and two local interconnects LI.

A source line layer SL is below the alternating dielectric layers and word line layers. Memory holes are formed in the stack of alternating dielectric layers and conductive layers. For example, one of the memory holes is marked as MH. Note that in FIG. 3 the dielectric layers are depicted as see-through so that the reader can see the memory holes positioned in the stack of alternating dielectric layers and conductive layers.

In an embodiment, NAND strings are formed by filling the memory hole with materials including a charge-trapping material to create a vertical column of memory cells (also referred to as a memory column). In an embodiment, each memory cell can store one or more bits of data. In an embodiment, each memory hole MH is associated with and coupled to a corresponding one of bit lines BL. In an embodiment, each bit line BL is coupled to one or more memory holes MH. More details of a three dimensional memory array that comprises memory structure 202 are described below.

Figure 4A:
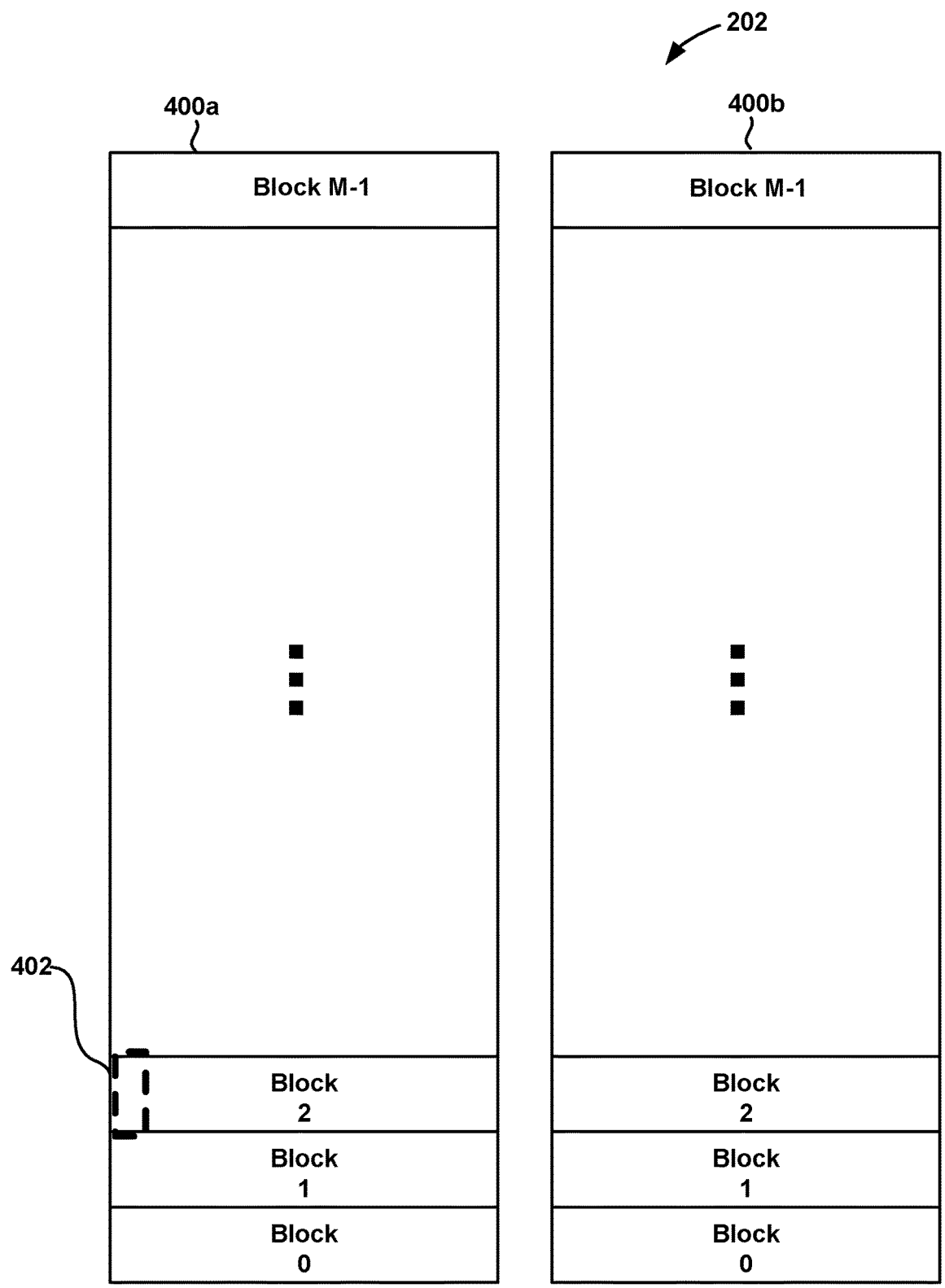
FIG. 4A is a block diagram of a memory structure having two planes.

FIG. 4A is a block diagram explaining one example organization of memory structure 202, which is divided into two planes 400a and 400b. Both planes are on the same memory die 200 (FIG. 2). Each plane is then divided into M blocks. In one example, each plane has about 2000 blocks. However, different numbers of blocks and planes also can be used. A portion 402 of block 2 of memory plane 400a is shown in dashed line in FIG. 4A.

In an embodiment, a block of memory cells is a unit of erase. That is, all memory cells of a block are erased together. In other embodiments, memory cells can be grouped into blocks for other reasons, such as to organize memory structure 202 to enable the signaling and selection circuits. In some embodiments, a block represents a group of connected memory cells as the memory cells of a block share a common set of word lines. Although FIG. 4A shows two planes on the same die, in other embodiments more than two planes can be implemented. For example, memory structure 202 can include 2-8 (or more) planes.

Figure 4B:
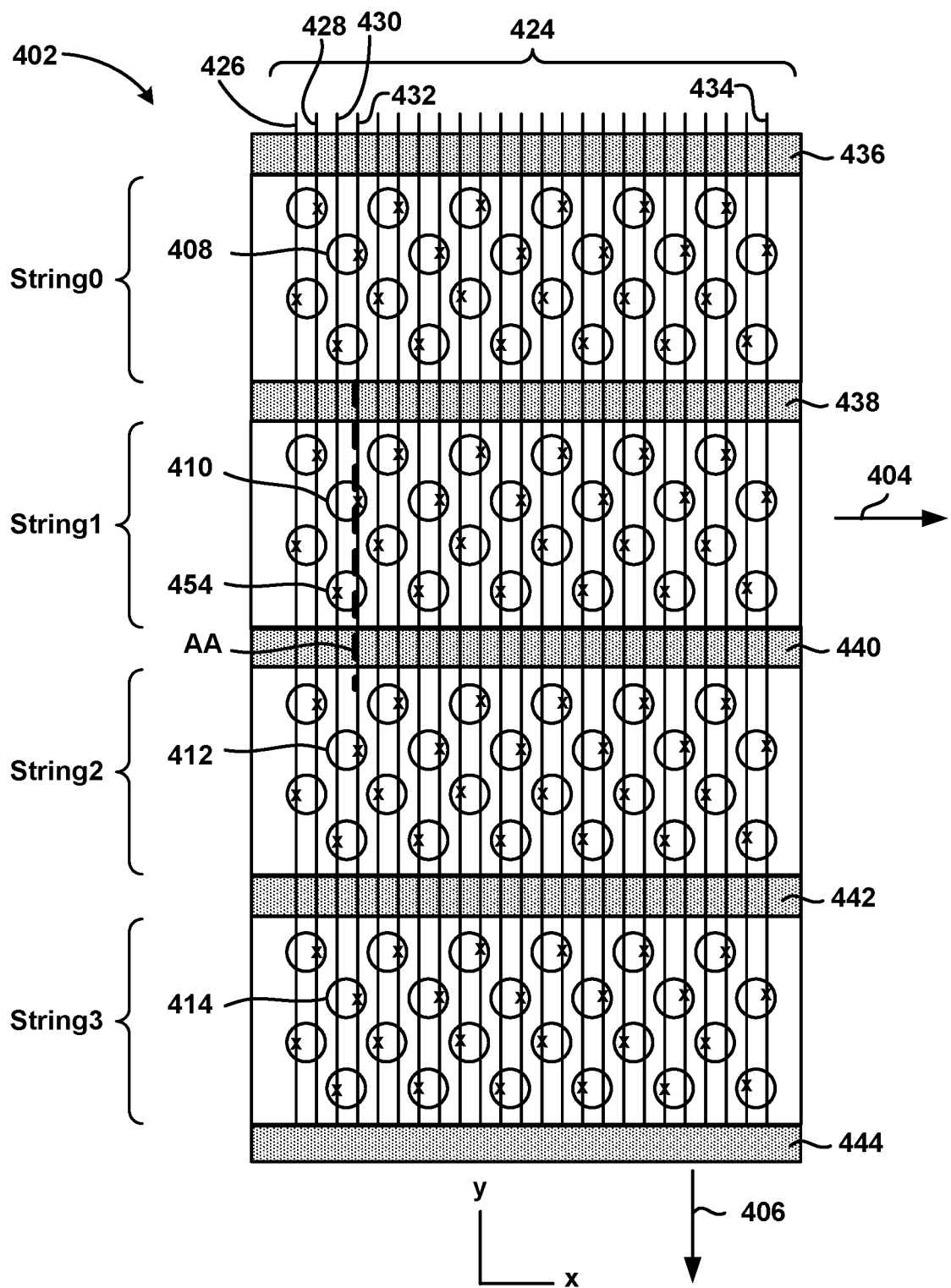
FIG. 4B depicts a top view of a portion of a block of memory cells.

FIGS. 4B-4F depict an example three dimensional ("3D") NAND structure that corresponds to the structure of FIG. 3. FIG. 4B is a block diagram depicting a top view of portion 402 (FIG. 4A) of memory structure 202. As can be seen from FIG. 4B, portion 402 extends in direction 404 and direction 406. In an embodiment, the memory array has many layers, however, FIG. 4B only shows the top layer.

FIG. 4B depicts a plurality of circles that represent the memory holes, which are also referred to as memory columns. For example, FIG. 4B depicts memory holes 408, 410, 412 and 414. Each of the memory holes include multiple select transistors (also referred to as a select gate or selection gate) and multiple memory cells. In an embodiment, each memory hole implements a NAND string. Because portion 402 extends in directions 404 and 406, the block includes more memory holes than depicted in FIG. 4B.

FIG. 4B also depicts a set of bit lines 424, including bit lines 426, 428, 430, 432, . . . 434. In an embodiment, each memory hole is associated with and coupled to a corresponding one of the bit lines. In an embodiment, each bit line is coupled to one or more memory holes. FIG. 4B shows twenty four bit lines because only a portion of the block is depicted. It is contemplated that more than twenty four bit lines are connected to memory holes of the block. Each of the circles representing a memory hole has an "x" to indicate its connection to one bit line. For example, bit line 432 is connected to memory holes 408, 410, 412 and 414.

Portion 402 depicted in FIG. 4B includes a set of local interconnects 436, 438, 440, 442 and 444 that connect the various layers to a source line below the memory holes. Local interconnects 436, 438, 440, 442 and 444 also serve to divide each layer of the block into four regions. For example, the top layer depicted in FIG. 4B is divided into four regions designated as String0, String1, Sting2 and String3. In the layers of the block that implement memory cells, String0, String1, Sting2 and String3 also may be referred to as word line fingers that are separated by the local interconnects.

In an embodiment, the word line fingers on a common level of a block connect together to form a single word line. In another embodiment, the word line fingers on the same level are not connected together. In an example implementation, a bit line connects to a single memory hole in each of String0, String1, Sting2 and String3. In that implementation, each block has sixteen rows of active columns and each bit line connects to four rows in each block.

In an embodiment, all four rows connected to a common bit line are connected to the same word line (via different word line fingers on the same level that are connected together). Therefore, the system uses the source side selection lines and the drain side selection lines to choose one (or another subset) of the four to be subjected to a memory operation (program, verify, read, and/or erase).

Although FIG. 4B shows four regions String0, String1, Sting2 and String3, each having four rows of memory holes, and sixteen rows of memory holes in a block, those exact numbers are an example implementation. Other embodiments may include more or less regions per block, more or less rows of memory holes per region and more or less rows of memory holes per block. FIG. 4B also shows the memory holes being staggered. In other embodiments, different patterns of staggering can be used. In some embodiments, the memory holes are not staggered.

Figure 4C:
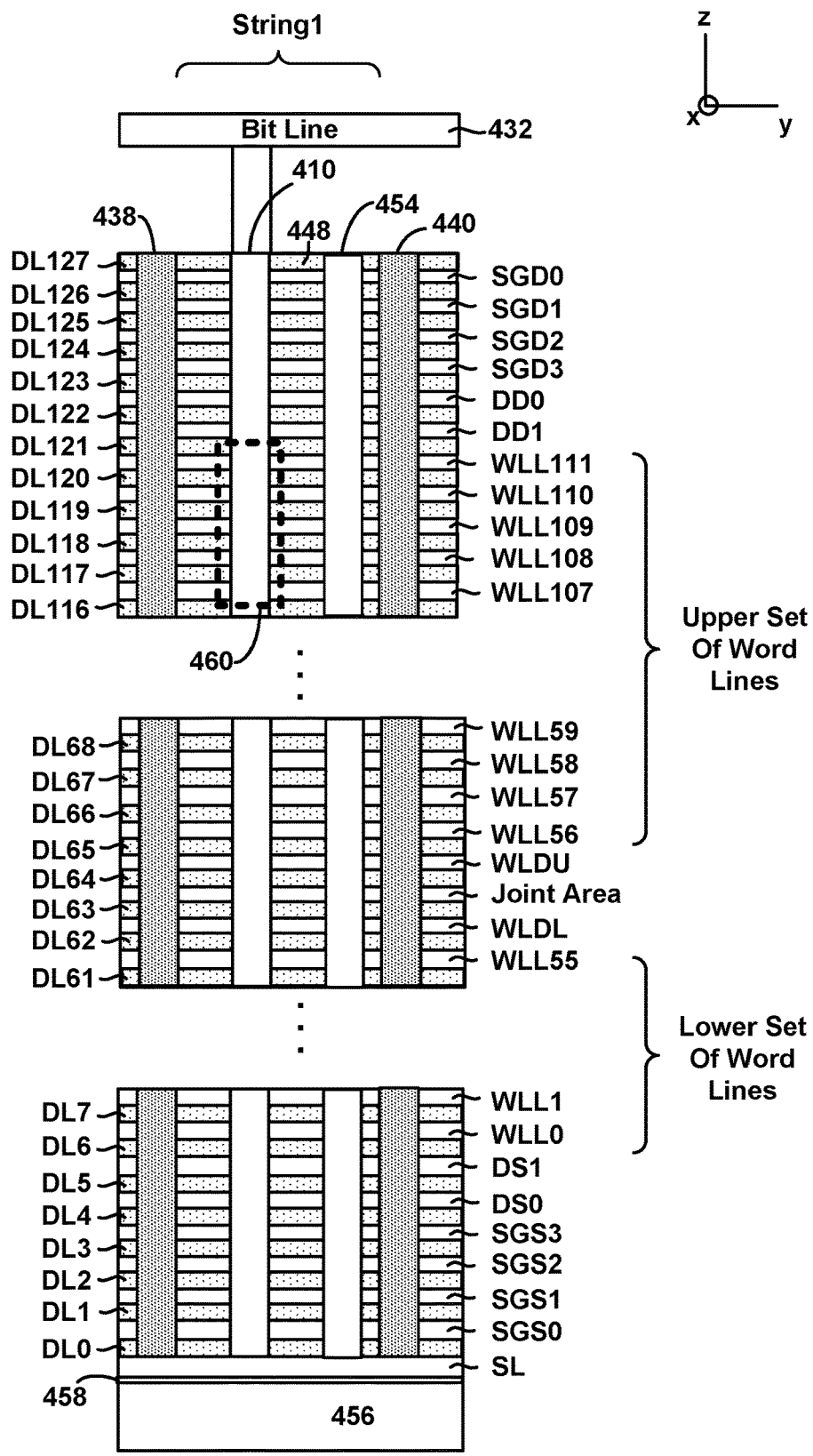
FIG. 4C depicts a cross sectional view of a portion of a block of memory cells.

FIG. 4C depicts a portion of one embodiment of a three dimensional memory structure 202 showing a cross-sectional view along line AA of FIG. 4B. This cross sectional view cuts through memory holes 410 and 454 of String1 (see FIG. 4B). The structure of FIG. 4C includes four drain side select layers SGD0, SGD1, SGD2 and SGD3, four source side select layers SGS0, SGS1, SGS2 and SGS3, six dummy word line layers DD0, DD1, DS0, DS1, WLDL, WLDU, and one hundred and twelve data word line layers WLL0-WLL111 for connecting to memory cells. Other embodiments can implement more or less than four drain side select layers, more or less than four source side select layers, more or less than six dummy word line layers, and more or less than one hundred and twelve word lines.

Memory holes 410 and 454 are depicted protruding through the drain side select layers, source side select layers, dummy word line layers and word line layers. In one embodiment, each memory hole includes a vertical NAND string. Below the memory holes and the layers listed below is substrate 456, an insulating film 458 on the substrate, and source line SL. The NAND string of memory hole 410 has a source end at a bottom of the stack and a drain end at a top of the stack. As in agreement with FIG. 4B, FIG. 4C shows memory hole 410 connected to bit line 432 via connector 460. Local interconnects 438 and 440 also are depicted.

For ease of reference, drain side select layers SGD0, SGD1, SGD2 and SGD3, source side select layers SGS0, SGS1, SGS2 and SGS3, dummy word line layers DD0, DD1, DS0, DS1, WLDL and WLDU, and word line layers WLL0-WLL111 collectively are referred to as the conductive layers. In an embodiment, the conductive layers are made from a combination of TiN and tungsten. In other embodiments, other materials can be used to form the conductive layers, such as doped polysilicon, metal such as tungsten or metal silicide. In some embodiments, different conductive layers can be formed from different materials.

Between conductive layers are dielectric layers DL0-DL127. For example, dielectric layer DL120 is above word line layer WLL110 and below word line layer WLL111. In an embodiment, the dielectric layers are made from $SiO_2$. In other embodiments, other dielectric materials can be used to form the dielectric layers.

The non-volatile memory cells are formed along memory holes which extend through alternating conductive and dielectric layers in the stack. In an embodiment, the memory cells are arranged in NAND strings. The word line layers WLL0-WLL111 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data.

In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a "Joint Area." In an embodiment it is expensive and/or challenging to etch one hundred and twelve word line layers intermixed with dielectric layers. To ease this burden, one embodiment includes laying down a first stack of fifty-six word line layers alternating with dielectric layers, laying down the Joint Area, and laying down a second stack of fifty-six word line layers alternating with dielectric layers. The Joint Area is positioned between the first stack and the second stack. The Joint Area is used to connect the first stack to the second stack.

In FIG. 4C, the first stack is labeled as the "Lower Set of Word Lines" and the second stack is labeled as the "Upper Set of Word Lines." In an embodiment, the Joint Area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
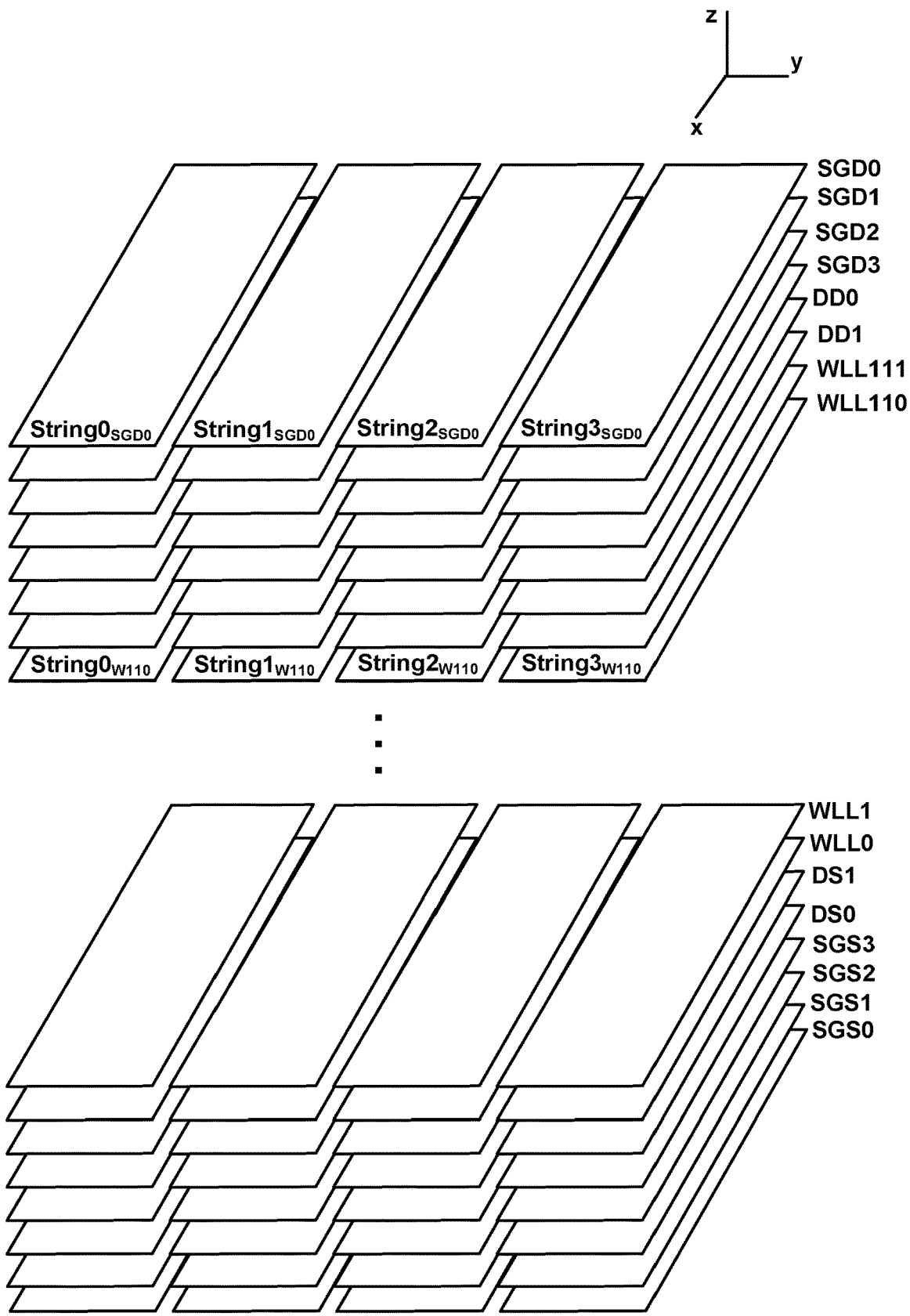
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL111) for the block that is partially depicted in FIG. 4C. As mentioned above with respect to FIG. 4B, in an embodiment local interconnects 436, 438, 440, 442 and 444 break up the conductive layers into four regions/fingers.

For example, word line layer WLL110 is divided into regions $String0_{WLL110}$, $String1_{WLL110}$, $String2_{WLL110}$ and $String3_{WLL110}$. In an embodiment, the four word line fingers on a same level are connected together. In another embodiment, each word line finger operates as a separate word line.

Likewise, drain side select gate layer SGD0 (the top layer) is divided into regions $Strin0_{SGD0}$, $String1_{SGD0}$, $String2_{SGD0}$ and $String3_{SGD0}$, also known as fingers or select line fingers. In an embodiment, the four select line fingers on a same level are connected together. In another embodiment, each select line finger operates as a separate word line.

Figure 4E:
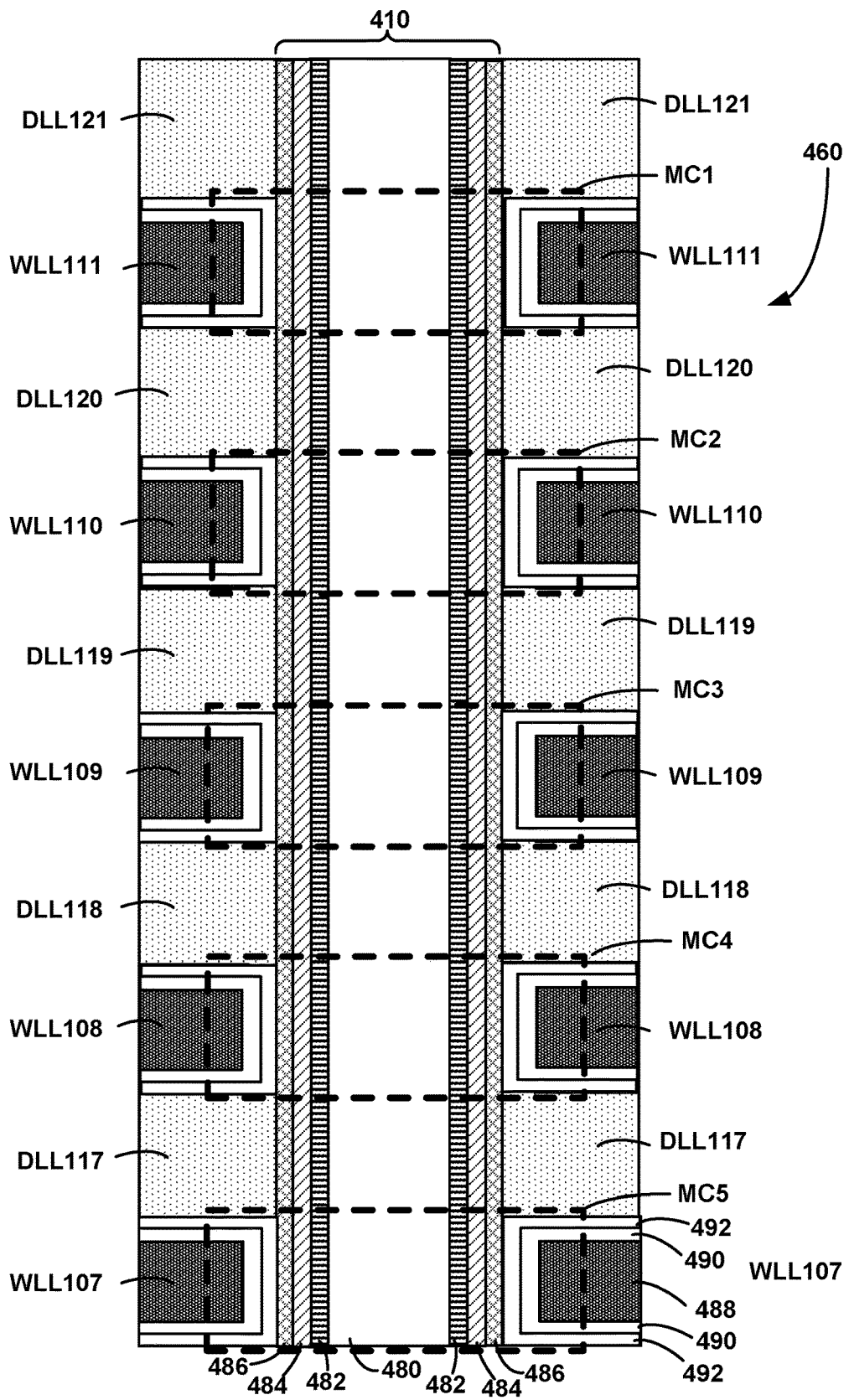
FIG. 4E is a cross sectional view of a memory hole of memory cells.

FIG. 4E depicts a cross sectional view of String1 of FIG. 4C that includes a portion of memory hole 410. In an embodiment, the memory holes (e.g., memory hole 410) are shaped as cylinders. In other embodiment, however, memory holes may have other shapes. In an embodiment, memory hole 410 includes an inner core layer 480, a channel 482 surrounding inner core layer 480, a tunneling dielectric 484 surrounding channel 482, and a charge trapping layer 486 surrounding tunneling dielectric 484. In an embodiment, inner core layer 480 a dielectric material (e.g., $SiO_2$), channel 482 is polysilicon, tunneling dielectric 484 has an ONO structure, and charge trapping layer 486 is silicon nitride. Other memory materials and structures can also be used. The technology described herein is not limited to any particular material or structure.

FIG. 4E depicts dielectric layers DLL121, DLL120, DLL119, DLL118 and DLL117, as well as word line layers WLL107, WLL108, WLL109, WLL110, and WLL111. In an embodiment, each of the word line layers includes a word line region 488 surrounded by an aluminum oxide layer 490, which is surrounded by a blocking oxide ($SiO_2$) layer 492. The physical interaction of the word line layers with the memory hole forms the memory cells. Thus, a memory cell, in an embodiment, includes channel 482, tunneling dielectric 484, charge trapping layer 486, blocking oxide layer 492, aluminum oxide layer 490 and word line region 488.

For example, word line layer WLL111 and a portion of memory hole 410 comprise a memory cell MC1. Word line layer WLL110 and a portion of memory hole 410 comprise a memory cell MC2. Word line layer WLL109 and a portion of memory hole 410 comprise a memory cell MC3. Word line layer WLL108 and a portion of memory hole 410 comprise a memory cell MC4. Word line layer WLL107 and a portion of memory hole 410 comprise a memory cell MC5. In other architectures, a memory cell may have a different structure; however, the memory cell would still be the storage unit.

In an embodiment, when a memory cell is programmed, electrons are stored in a portion of the charge trapping layer 486 which is associated with the memory cell. These electrons are drawn into the charge trapping layer 486 from the channel 482, through the tunneling dielectric 484, in response to an appropriate voltage on word line region 488. The threshold voltage of a memory cell is increased in proportion to the amount of stored charge.

In an embodiment, programming a memory cell is achieved through Fowler-Nordheim tunneling of the electrons into charge trapping layer 486. During an erase operation, the electrons return to channel 482 or holes are injected into charge trapping layer 486 to recombine with electrons. In an embodiment, erasing is achieved using hole injection into charge trapping layer 486 via a physical mechanism such as gate induced drain leakage (GIDL).

Figure 4F:
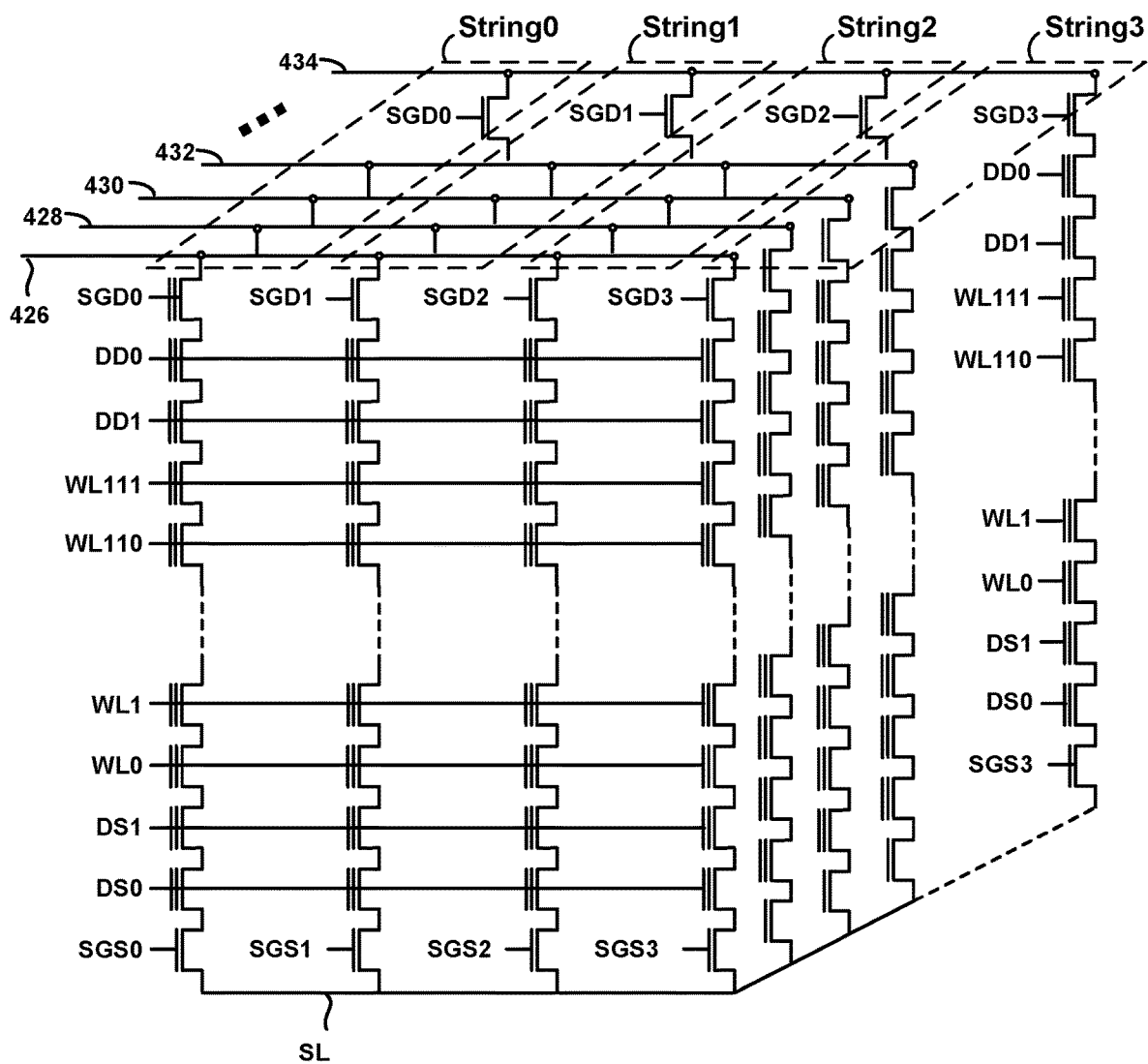
FIG. 4F is a schematic of a plurality of NAND strings.

FIG. 4F is a schematic diagram of corresponding to portion 402 in Block 2 of FIGS. 4A-E, including bit lines 426, 428, 430, 432, . . . 434, and word lines WLL0-WLL111. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line.

During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

During a memory operation some word lines are referred to as selected word lines because they are connected to selected memory cells. Unselected word lines are not connected to selected memory cells. Similarly, selected bit lines are connected to selected memory cells and unselected bit lines are not connected to selected memory cells.

Although the example memory system of FIG. 3 and FIGS. 4A-4F is a three dimensional memory structure that includes vertical NAND strings with charge-trapping material, other (2D and 3D) memory structures also can be used with the technology described herein.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate.

Each memory cell may be associated with a memory state according to write data in a program command. Based on its memory state, a memory cell will either remain in the erased state or be programmed to a memory state (a programmed state) different from the erased state. For example, in a two-bit per cell memory device, there are four memory states including the erased state (S0) and three programmed states referred to as the S1, S2 and S3 programmed states.

In a three-bit per cell memory device, there are eight memory states including the erased state S0 and seven programmed states referred to as the S1, S2, S3, S4, S5, S6 and S7 programmed states. In a four-bit per cell memory device, there are sixteen memory states including the erased state S0 and fifteen programmed states referred to as the S1, S2, S3, S4, S5, S6, S7, S8, S9, S10, S11, S12, S13, S14 and S15 programmed states.

Figure 5A:
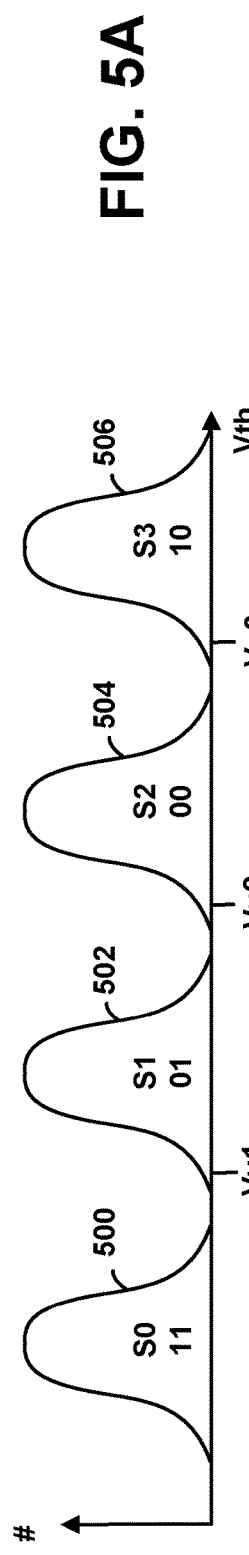
FIG. 5A depicts an embodiment of threshold voltage distributions for a four-state memory device in which each memory cell stores two bits of data.

FIG. 5A depicts an embodiment of threshold voltage distributions for a four-state memory device in which each memory cell stores two bits of data. A first Vth distribution 500 is provided for erased state (S0) storage elements. Three Vth distributions 502, 504 and 506 represent programmed states S1, S2 and S3, respectively. A 2-bit code having lower and upper bits can be used to represent each of the four memory states. In an embodiment, the "S0," "S1," "S2," and "S3" memory states are respectively represented by "11," "01," "00," and "10."

Figure 5B:
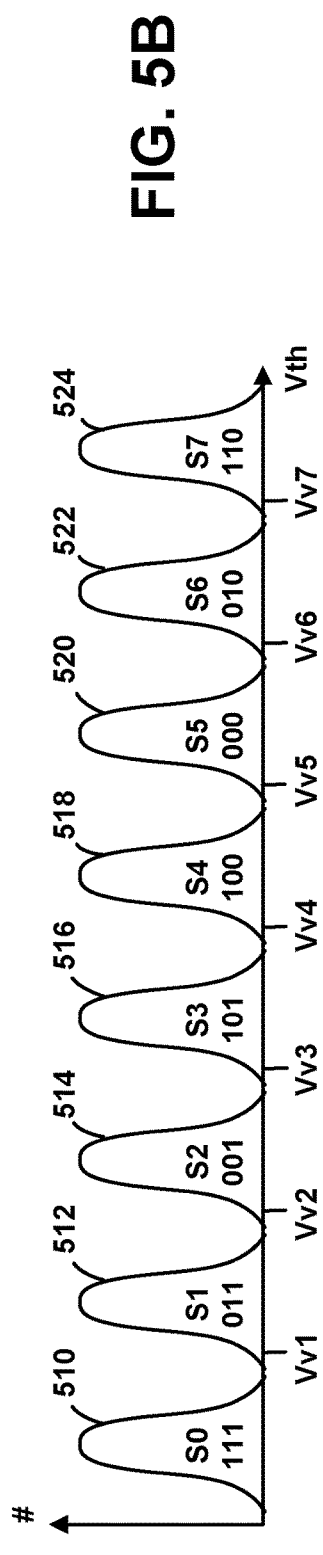
FIG. 5B depicts an embodiment of threshold voltage distributions for an eight-state memory device in which each memory cell stores three bits of data.

FIG. 5B depicts an embodiment of threshold voltage distributions for an eight-state memory device in which each memory cell stores three bits of data. A first Vth distribution 510 is provided for erased state (S0) storage elements. Seven Vth distributions 512, 514, 516, 518, 520, 522 and 524 represent programmed states S1, S2, S3, S4, S5, S6 and S7, respectively. A 3-bit code having lower, middle and upper bits can be used to represent each of the eight memory states. In an embodiment, the "S0," S1, S21, S3, S4, S5, S6 and S7 memory states are respectively represented by "111," "011," "001," "101," "100," "000," "010" and "110."

FIG. 5B also shows seven verify reference voltages, Vv1, Vv2, Vv3, Vv4, Vv5, Vv6, and Vv7. When programming memory cells to programmed states S1, S2, S3, S4, S5, S6 and S7, the system will test whether those memory cells have a threshold voltage greater than or equal to Vv1, Vv2, Vv3, Vv4, Vv5, Vv6 and Vv7, respectively.

Figure 5C:
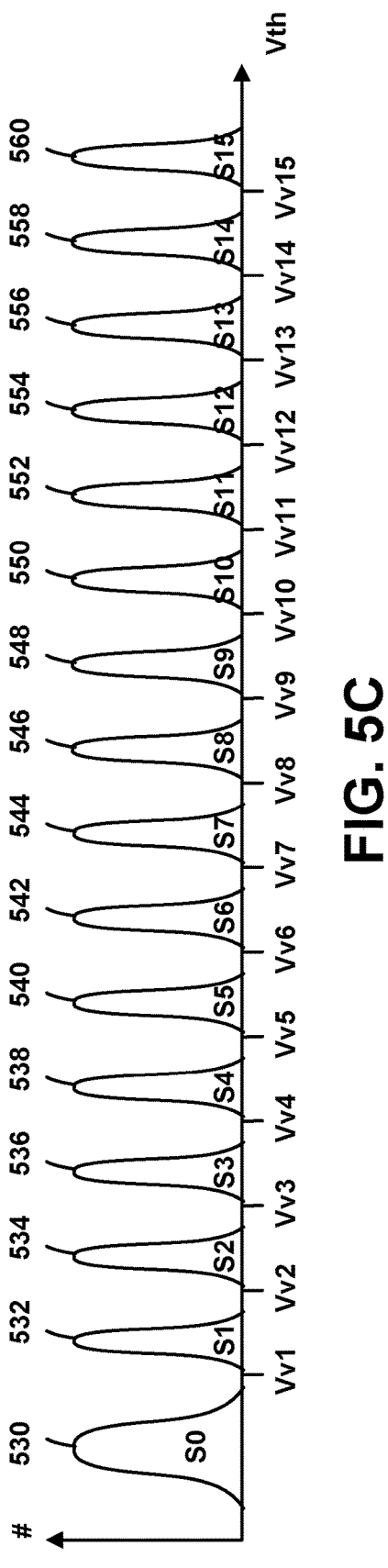
FIG. 5C depicts an embodiment of threshold voltage distributions for a sixteen-state memory device in which each memory cell stores four bits of data.

FIG. 5C depicts an embodiment of threshold voltage distributions for a sixteen-state memory device in which each memory cell stores four bits of data. A first Vth distribution 530 is provided for erased state (S0) storage elements. Fifteen Vth distributions 532, 534, 536, 538, 540, 542, 544, 546, 548, 550, 552, 554, 556, 558 and 560 represent programmed states S1, S2, S3, S4, S5, S6, S7, S8, S9, S10, S11, S12, S13, S14 and S15, respectively.

Referring again to FIG. 5B, seven verify reference voltages, Vv1, Vv2, Vv3, Vv4, Vv5, Vv6, and Vv7 are depicted. When programming memory cells to programmed states S1, S2, S3, S4, S5, S6 and S7, the system will test whether those memory cells have a threshold voltage greater than or equal to Vv1, Vv2, Vv3, Vv4, Vv5, Vv6 and Vv7, respectively.

Figure 6:
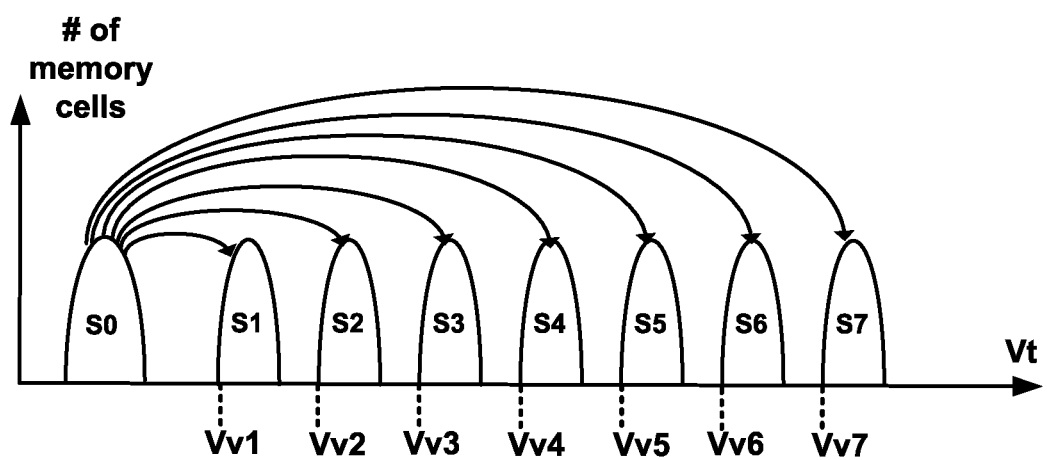
FIG. 6 depicts threshold voltage distributions and describe a process for programming non-volatile memory.

In an embodiment, known as full sequence programming, memory cells can be programmed from the erased state S0 directly to any of the programmed states S1-S7. For example, referring to FIG. 6, a population of memory cells to be programmed may first be erased so that all memory cells in the population are in erased state S0. Then, a programming process is used to program memory cells directly into programmed states S1, S2, S3, S4, S5, S6, and/or S7. While some memory cells are being programmed from erased state S0 to programmed state S1, other memory cells are being programmed from erased state S0 to programmed state S2 and/or from erased state S0 to programmed state S3, and so on.

The technology described herein also can be used with other types of programming in addition to full sequence programming (including, but not limited to, multiple stage/ phase programming). In some embodiments, programmed states S1-S7 can overlap, with controller 104 (FIG. 1) relying on error correction to identify the correct data being stored.

FIGS. 7A-7E illustrate a multi-phase programming approach. In this embodiment, the programming process includes three phases. Prior to programming, the memory cells are erased so that all memory cells connected to a common word line are in an erased threshold voltage distribution E, as depicted in FIG. 7A.

During the first programming phase, those memory cells whose targets (due to the data to be stored in those memory cells) are programmed states S4, S5, S6 or S7 are programmed to an intermediate threshold voltage distribution IM. Those memory cells are targeted for programmed states S0, S1, S2 or S3 remain in the erased threshold voltage distribution E. The first phase is graphically depicted in FIG. 7B. Memory cells being programmed to intermediate threshold voltage distribution IM are programmed to a target threshold voltage of VvIM.

During the second programming phase, those memory cells that are in the erased threshold voltage distribution E are programmed to their target programmed states. For example, those memory cells to be programmed to programmed state S3 are programmed from erased threshold voltage distribution E to programmed state S3, those memory cells to be programmed to programmed state S2 are programmed from erased threshold voltage distribution E to programmed state S2, those memory cells to be programmed to programmed state S1 are programmed from erase threshold voltage distribution E to programmed state S1, and those memory cells to be in data state S0 are not programmed during the second phase of the programming process. Thus, erased threshold voltage distribution E becomes data state S0.

Also, during the second programming phase, those memory cells that are in the intermediate state threshold voltage distribution IM are programmed to their target programmed states. For example, those memory cells to be programmed to programmed state S7 are programmed from intermediate threshold voltage distribution IM to programmed state S7, those memory cells to be programmed to programmed state S6 are programmed from intermediate threshold voltage distribution IM to programmed state S6, those memory cells to be programmed to programmed state S5 are programmed from intermediate threshold voltage distribution IM to programmed state S5, and those memory cells to be in programmed state S4 are programmed from intermediate threshold voltage distribution IM to programmed state S4. This second programming phase is illustrated in FIG. 7C.

As can be seen in FIG. 7C, at the end of the second programming phase data states S1-S7 overlap with neighboring programmed states. For example, programmed state S1 overlaps with programmed state S2, programmed state S2 overlaps with programmed states S1 and S3, programmed state S3 overlaps with programmed states S2 and S4, programmed state S4 overlaps with programmed states S3 and S5, programmed state S5 overlaps with programmed states S4 and S6, and data state S6 overlaps with programmed states S5 and S7. In some embodiments, all or some of the programmed states do not overlap.

In the third programming phase, each of programmed states S1-S7 are tightened so that they no longer overlap with neighboring states. This is depicted graphically by FIG. 7D. The final result of the three phrase programming process is depicted in FIG. 7E, which shows data states S0-S7. In some embodiments, data state S0 is wider than programmed states S1-S7. In an embodiment, the data states of FIGS. 7A-7E may be encoded according to the table of FIG. 6.

In some embodiments, those memory cells to be programmed to programmed state S4 are not programmed during the second phase and, therefore, remain in intermediate threshold voltage distribution IM. During the third programming phase, the memory cells are programmed from intermediate threshold voltage distribution IM to programmed state S4. In other embodiments, memory cells destined for other states can also remain in intermediate threshold voltage distribution IM or erase threshold voltage distribution E during the second phase.

A programming operation for a set of memory cells typically involves applying a series of program voltage pulses to the memory cells after the memory cells are provided in an erased state. For example, the program voltage pulses may be applied to a word line which is connected to control gates of the memory cells.

In one approach, incremental step pulse programming (ISPP) is performed, where the program voltage pulse amplitude is sequentially increased by a step size. Verify operations may be performed after each program voltage pulse to determine whether the memory cells have completed programming. When programming is completed for a memory cell, the memory cell can be locked out from further programming while programming continues for other memory cells.

Figure 8:
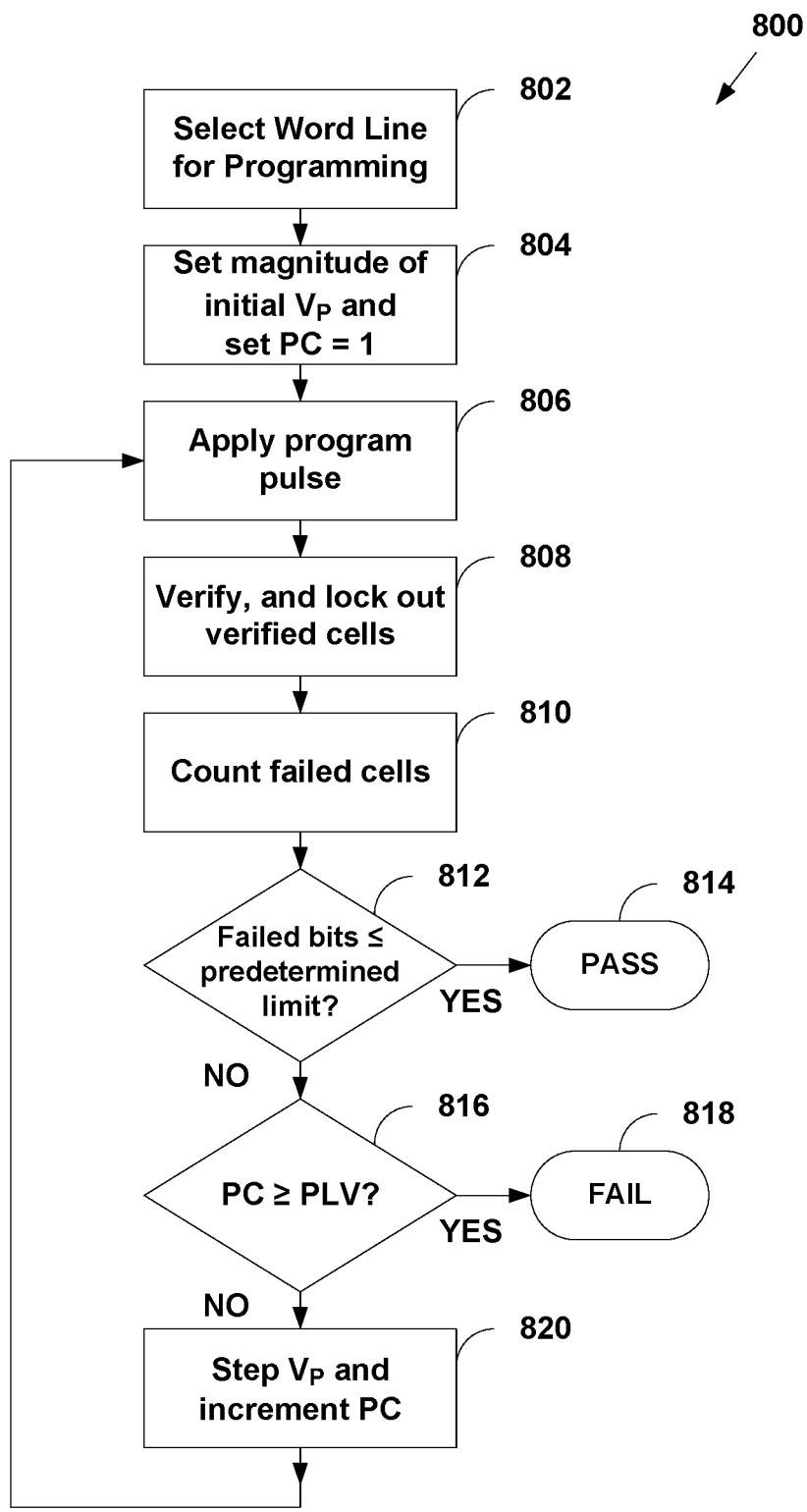
FIG. 8 is a flowchart describing an embodiment of a process for programming non-volatile memory.

FIG. 8 is a flowchart describing an embodiment of a process 800 for programming memory cells. In an example embodiment, process 800 is performed on memory die 106 (FIG. 1) using the Control Circuit discussed above. For example, process 800 can be performed at the direction of state machine 216 (FIG. 2). Process 800 also can be used to implement the full sequence programming discussed above. Additionally, process 800 can be used to implement each phase of a multi-phase programming process.

At step 802, a word line is selected for programming. In an embodiment, the selected word line is coupled to one or more memory cells. In an embodiment, each memory cell coupled to the selected word line is in an erased state prior to programming. In an embodiment, during programming each memory cell coupled to the selected word line will be left in the erased state or programmed to one of multiple programmed states, such as the programmed states depicted in FIGS. 5A-5C.

In step 804, a programming voltage ($V_P$) is initialized to a starting program voltage $V_{Pinit}$ (e.g., between about 12V to about 16V, or some other value) and a program counter PC maintained by state machine 216 is initialized at 1.

In step 806, a program pulse having a magnitude $V_P$ is applied to the selected word line (the word line selected for programming). In an embodiment, the group of memory cells being concurrently programmed are all connected to the selected word line. If a memory cell is to be programmed, then the corresponding bit line coupled to the memory cell is grounded.

If a memory cell should remain at its current threshold voltage, then the corresponding bit line coupled to the memory cell is connected to Vdd to inhibit programming. In an embodiment, the unselected word lines receive one or more boosting voltages (e.g., between about 7V to about 11V, or some other value) to perform boosting schemes known in the art.

In step 806, the program pulse is applied to all memory cells connected to the selected word line so that all of the connected memory cells are programmed concurrently. That is, they are programmed at the same time or during overlapping times (both of which are considered concurrent). In this manner all memory cells connected to the selected word line will concurrently have their threshold voltage change, unless they have been locked out from programming.

In step 808, the memory cells are verified using the appropriate set of verify reference voltages to perform one or more verify operations. In an embodiment, the verification process is performed by testing whether the threshold voltages of the memory cells selected for programming have reached the appropriate verify reference voltage.

In step 810, the memory system counts the number of memory cells that have not yet reached their respective target threshold voltage distribution. That is, the system counts the number of memory cells that have so far failed the verify process. This counting can be done by the Control Circuit described above, or other logic.

In an embodiment, each of sense blocks 212 (FIG. 2) stores the status (pass/fail) of their respective memory cells. In an embodiment, one total count reflects the total number of memory cells currently being programmed that have failed the last verify step. In another embodiment, separate counts are kept for each data state.

In step 812, a determination is made whether the count from step 810 is less than or equal to a predetermined limit. In an embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 814. In this situation, enough memory cells programmed correctly such that the few remaining memory cells that have not been completely programmed can be corrected using ECC during the read process.

In some embodiments, the predetermined limit used in step 812 is below the number of bits that can be corrected by error correction codes (ECC) during a read process to allow for future/additional errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, the limit changes based on the number of errors already counted for the page, the number of program-erase cycles performed or other criteria.

If the number of failed memory cells is not less than the predetermined limit, then the programming process continues at step 816 and the program counter PC is checked against a program limit value (PLV). An example program limit value is PLV=28 although other values can be used. If the program counter PC is greater than or equal to program limit value PLV, then the program process is considered to have failed and a status of FAIL is reported in step 818.

If the program counter PC is not greater than or equal to program limit value PLV, then the process continues at step 820 in which the Program Counter PC is incremented by 1 and program voltage $V_P$ is stepped up to the next magnitude. For example, the next program pulse will have a magnitude greater than the previous pulse by a program step size $\Delta V_P$ (e.g., a step size of between about 0.1V to about 1.0V, or some other value).

Process 800 loops back to step 806 and another program pulse is applied to the selected word line so that another iteration (steps 806-820) of programming process 800 is performed. Each pass through steps 806-820 is referred to herein as a "program loop." The program limit value PLV described above therefore specifies a maximum number of program loops that may be used to program the memory cells coupled to the selected word line. The comparison performed at step 816 is referred to herein as a "maximum program count test."

In general, during verify operations, the selected word line is connected to a voltage (one example of a reference signal), a level of which is specified for each verify operation (e.g. verify target levels Vv1, Vv2, Vv3, Vv4, Vv5, Vv6, and Vv7 of FIG. 5B) to determine whether a threshold voltage of the selected memory cell has reached such level.

In an embodiment, after an appropriate read or verify voltage is applied to a selected word line, a conduction current of the memory cell is measured to determine whether the memory cell turned ON (conducts current) in response to the voltage applied to the word line. If the conduction current is measured to be greater than a certain value, then it is assumed that the memory cell turned ON and the voltage applied to the word line is greater than the threshold voltage of the memory cell.

If the conduction current is measured to be not greater than the certain value, then the memory cell did not turn ON, and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate at which the memory cell discharges or charges a dedicated capacitor in a sense amplifier. In another example, the conduction current of the selected memory cell allows (or fails to allow) the NAND string that includes the memory cell to discharge a corresponding bit line. The voltage on the bit line is measured after a period of time to see whether or not the bit line has been discharged. Note that the technology described herein can be used with different methods known in the art for verifying/reading. Other read and verify techniques known in the art also can be used.

As described above, at step 806 a program pulse is applied to the selected word line, and at step 808 memory cells coupled to the selected word line are verified using an appropriate set of verify reference voltages to perform one or more verify operations. Steps 806 and 808 are part of an iterative loop in which program pulses are applied as a series of program pulses that step up in magnitude, with intervening verify reference pulses between consecutive program pulses. Such an iterative loop is referred to herein as a "program-verify iteration."

Figure 9:
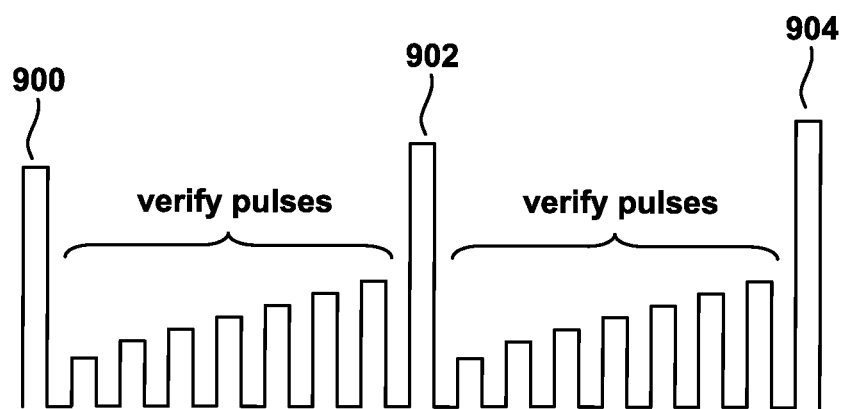
FIG. 9 depicts a word line voltage during programming and verify operations.

FIG. 9 illustrates an example of such program-verify pulses applied to a selected word line. In particular, FIG. 9 depicts program pulses 900, 902 and 904 applied to the selected word line during three successive iterations of step 806 of FIG. 8. Between program pulses 900, 902 and 904 verify pulses are applied to the selected word line during three successive program-verify iterations of steps 806-808 of FIG. 8 to determine whether threshold voltages of the memory cells are greater than the respective verify reference voltages.

Referring again to FIG. 8, in process 800 a program failure is deemed to have occurred at step 816 if the program counter PC is greater than or equal to program limit value PLV. Such a program failure typically indicates that the word line being programmed has experienced some type of failure (e.g., an electrical short or some other failure). In such instances, the word line is determined to have failed.

In addition, in some instances the block that includes the failed word line may be determined to have failed. In some instances the failed block may be designated as a bad block, and no further memory operations are performed on the bad block. As described above, in some memory devices a program limit value PLV may be 28, or some other value. Waiting until this maximum number of program loops before determining that a word line failure and/or a block failure has occurred is wasteful and inefficient.

During a programming operation, a program loop count for a particular programmed state is a count of a number of program loops (e.g., steps 806-820 of process 800 of FIG. 8) used to complete programming for the particular programmed state. Without wanting to be bound by any particular theory, it is believed that programming failures, word line failures, and/or block failures may be detected earlier based on program loop counts for one or more programmed states. Such techniques are referred to herein as "early loop detection" techniques.

As used herein, $PL_X$ is the program loop count for state X. For example, referring to FIG. 5B, if programmed state X=S1 memory cells complete programming in four program loops, $PL_{S1}=4$. Likewise, if programmed state X=S4 memory cells complete programming in eight program loops, $PL_{S4}=10$, and so on.

For a population of memory cells, the program loop count for each programmed state typically falls within a corresponding range of values. For example, for programmed state X memory cells program loop count $PL_X$ may typically be between a corresponding lower limit ($L_X$) and a corresponding upper limit ($U_X$): $L_X \leq PL_X \leq U_X$. For example, $L_X=4$ and $U_X=7$, or some other values.

During programming, if programmed state X memory cells have a program loop count $PL_X$ that is not greater than or equal to corresponding lower limit $L_X$ and less than or equal to corresponding upper limit $U_X$, this may indicate that a program failure has occurred. As used herein, this type of early loop detection test is referred to as an "absolute program loop count test."

In addition, a difference in program loop counts for two different programmed states also may be an indication of program failure. For example, a difference between a first program loop count $PL_Y$ and a second program loop count $PL_X$ may typically be between a corresponding differential lower limit ($L_{YX}$) and a corresponding differential upper limit ($U_{YX}$): $L_{YX} \leq (PL_Y - PL_X) \leq U_{YX}$. For example, $L_{YX}=9$ and $U_{YX}=12$, or some other values.

During programming, if first programmed state Y memory cells have a first program loop count $PL_Y$ and second programmed state X memory cells have a second program loop count $PL_X$, and if the difference in program loop counts ($PL_Y - PL_X$) is not greater than or equal to corresponding differential lower limit $L_{YX}$ and less than or equal to corresponding differential upper limit $U_{YX}$, this may indicate that a program failure has occurred. As used herein, this type of early loop detection test is referred to as an "differential program loop count test."

Without wanting to be bound by any particular theory, it is believed that early loop detection tests such as absolute program loop count tests and differential program loop count tests may be used during programming operations to detect program failure earlier in the programming process than the maximum program count test described above process 800 of FIG. 8 (e.g., determining program failure if program counter PC exceeds program limit value PLV).

That is, without wanting to be bound by any particular theory, it is believed that early loop detection tests such as absolute program loop count tests and differential program loop count tests may provide a faster detection of programming failure, word line failure, and/or block failure than a maximum program count test.

Technology is described for programming processes that include early loop detection tests, such as an absolute program loop count test or a differential program loop count test. In an embodiment, a programming process includes an absolute program loop count test. In another embodiment, a programming process includes a differential program loop count test.

In the embodiments described below, an early loop detection flag (ELD) is used to specify whether an optional early loop detection test should be used to early detect programming failure, word line failure, and/or block failure. For example, if ELD=0 the early loop detection test should not be used, whereas if ELD=1, the early loop detection test should be used to early detect programming failure, word line failure, and/or block failure.

Figure 10A:
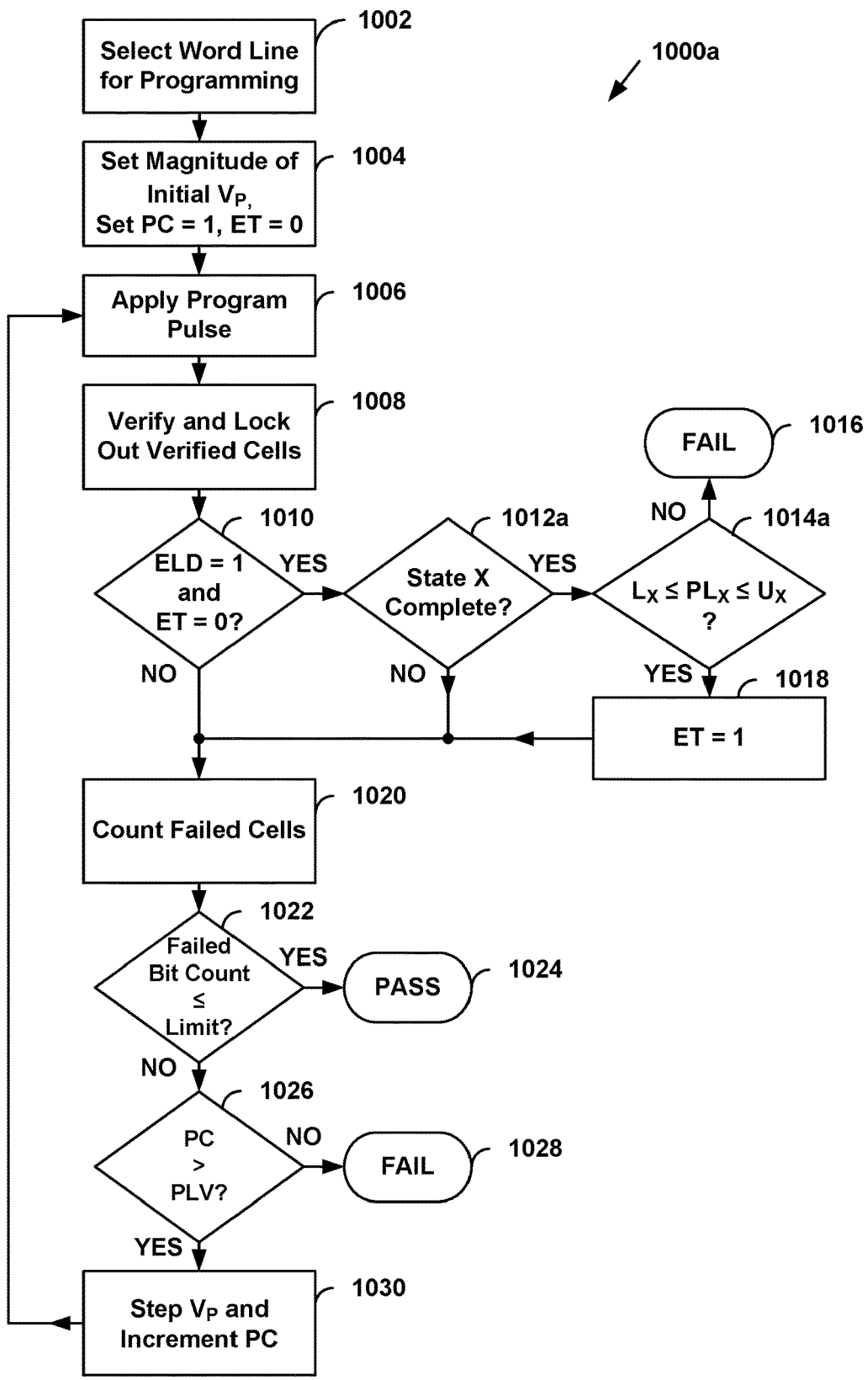
FIG. 10A is a flowchart describing an embodiment of a process for programming non-volatile memory.

FIG. 10A is a flowchart describing an embodiment of a process 1000a for programming memory cells. In an example embodiment, process 1000a is performed on memory die 106 (FIG. 1) using the Control Circuit discussed above. For example, process 1000a can be performed at the direction of state machine 216 (FIG. 2). Process 1000a also can be used to implement the full sequence programming discussed above. Additionally, process 1000a can be used to implement each phase of a multi-phase programming process.

At step 1002, a word line is selected for programming. In an embodiment, the selected word line is coupled to one or more memory cells. In an embodiment, each memory cell coupled to the selected word line is in an erased state prior to programming. In an embodiment, during programming each memory cell coupled to the selected word line will be left in the erased state or programmed to one of multiple programmed states, such as the programmed states depicted in FIGS. 5A-5C.

In step 1004, a programming voltage ($V_P$) is initialized to a starting program voltage $V_{Pinit}$ (e.g., between about 12V to about 16V, or some other value) and a program counter PC maintained by state machine 216 is initialized at 1. In a addition, an "early tested" flag ET is initialized to 0. As described in more detail below, early tested flag ET=0 indicates that an early loop detection test has not yet been performed, and early tested flag ET=1 indicates that an early loop detection test has been performed and has passed.

In step 1006, a program pulse having a magnitude $V_P$ is applied to the selected word line. In an embodiment, the group of memory cells being concurrently programmed are all connected to the selected word line. If a memory cell is to be programmed, then the corresponding bit line coupled to the memory cell is grounded.

If a memory cell should remain at its current threshold voltage, then the corresponding bit line coupled to the memory cell is connected to Vdd to inhibit programming. In an embodiment, the unselected word lines receive one or more boosting voltages (e.g., between about 7V to about 11V, or some other value) to perform boosting schemes known in the art.

In step 1006, the program pulse is applied to all memory cells connected to the selected word line so that all of the connected memory cells are programmed concurrently. That is, they are programmed at the same time or during overlapping times (both of which are considered concurrent). In this manner all memory cells connected to the selected word line will concurrently have their threshold voltage change, unless they have been locked out from programming.

In step 1008, the memory cells are verified using the appropriate set of verify reference voltages to perform one or more verify operations. In an embodiment, the verification process is performed by testing whether the threshold voltages of the memory cells selected for programming have reached the appropriate verify reference voltage.

At step 1010, a determination is made whether early loop detection flag ELD=1 and if early tested flag ET=0. As described above, at step 1004 early tested flag ET is initialized to 0. As also described above, if ELD=1 the early loop detection technique should be used to detect block failure. Thus, on the first pass through step 1010, if the early loop detection technique should be used to detect block failure, ELD=1 and ET=0, and process 1000a proceeds to step 1012a.

At step 1012a, a determination is made whether programming has completed for a particular programmed state X (e.g., X=S1 of FIG. 5B, or any other programmed state). If a determination is made at step 1012a that programming for programmed state X has completed, then at step 1014a a determination is made whether program loop count $PL_X$ is greater than or equal to corresponding lower limit $L_X$ and less than or equal to corresponding upper limit $U_X$. The test at step 1014a is an example of an absolute program loop count test.

If at step 1014a a determination is made that program loop count $PL_X$ is not greater than or equal to corresponding lower limit $L_X$ and less than or equal to corresponding upper limit $U_X$, then the absolute program loop count test is considered to have failed and a status of FAIL is reported in step 1016.

In an embodiment, upon receiving the FAIL status reported at step 1016, the Control Circuit determines that programming the memory cells coupled to the word line has failed. In an embodiment, upon receiving the FAIL status reported at step 1016, the Control Circuit determines that the word line has failed. In another embodiment, upon receiving the FAIL status reported at step 1016, the Control Circuit determines that the entire block of memory cells that includes the memory cells coupled to the word line has failed.

In contrast, if at step 1014a a determination is made that program loop count $PL_X$ is greater than or equal to corresponding lower limit $L_X$ and less than or equal to corresponding upper limit $U_X$, then the absolute program loop count test is considered to have passed. At step 1018 early tested flag is set to ET=1 to indicate that the early loop detection test has been performed and has passed, and process 1000a proceeds to step 1020.

In addition, if at step 1012a a determination is made that programming has not completed for a particular programmed state X, the absolute program loop count test at step 1014a should not be performed because such testing is premature. Accordingly, process 1000a proceeds to step 1020. Likewise, if at step 1010 a determination is made that early loop detection flag ELD≠1 (indicating that the early loop detection test should not be used) or if early tested flag ET≠0 (indicating that the early loop detection test has been performed and has passed), then the absolute program loop count test at step 1014a should not be performed. Accordingly, in both instances process 1000a proceeds to step 1020.

In step 1020, the memory system counts the number of memory cells that have not yet reached their respective target threshold voltage distribution. That is, the system counts the number of memory cells that have so far failed the verify process. This counting can be done by state machine 216 (FIG. 2), controller 104 (FIG. 1), or other logic.

In an embodiment, each of sense blocks 212 (FIG. 2) stores the status (pass/fail) of their respective memory cells. In an embodiment, one total count reflects the total number of memory cells currently being programmed that have failed the last verify step. In another embodiment, separate counts are kept for each data state.

In step 1022, a determination is made whether the count from step 1020 is less than or equal to a predetermined limit. In an embodiment, the predetermined limit is the number of bits that can be corrected by ECC during a read process for the page of memory cells. If the number of failed cells is less than or equal to the predetermined limit, than the programming process can stop and a status of "PASS" is reported in step 1024. In this situation, enough memory cells programmed correctly such that the few remaining memory cells that have not been completely programmed can be corrected using ECC during the read process.

In some embodiments, the predetermined limit used in step 1022 is below the number of bits that can be corrected by ECC during a read process to allow for future/additional errors. When programming less than all of the memory cells for a page, (or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, the limit changes based on the number of errors already counted for the page, the number of program-erase cycles performed or other criteria.

If the number of failed memory cells is not less than the predetermined limit, then the programming process continues at step 1026 and the program counter PC is checked against program limit value. An example program limit value is PLV=28 although other values can be used. If the program counter PC is greater than or equal to program limit value PLV, then the program process is considered to have failed and a status of FAIL is reported in step 1028.

If the program counter PC is not greater than or equal to program limit value PLV, then the process continues at step 1030 in which the Program Counter PC is incremented by 1 and program voltage $V_P$ is stepped up to the next magnitude. For example, the next program pulse will have a magnitude greater than the previous pulse by a program step size $\Delta V_P$ (e.g., a step size of between about 0.1V to about 1.0V, or some other value).

Process 1000a loops back to step 1006 and another program pulse is applied to the selected word line so that another iteration (steps 1006-1030) of programming process 1000a is performed.

Figure 10B:
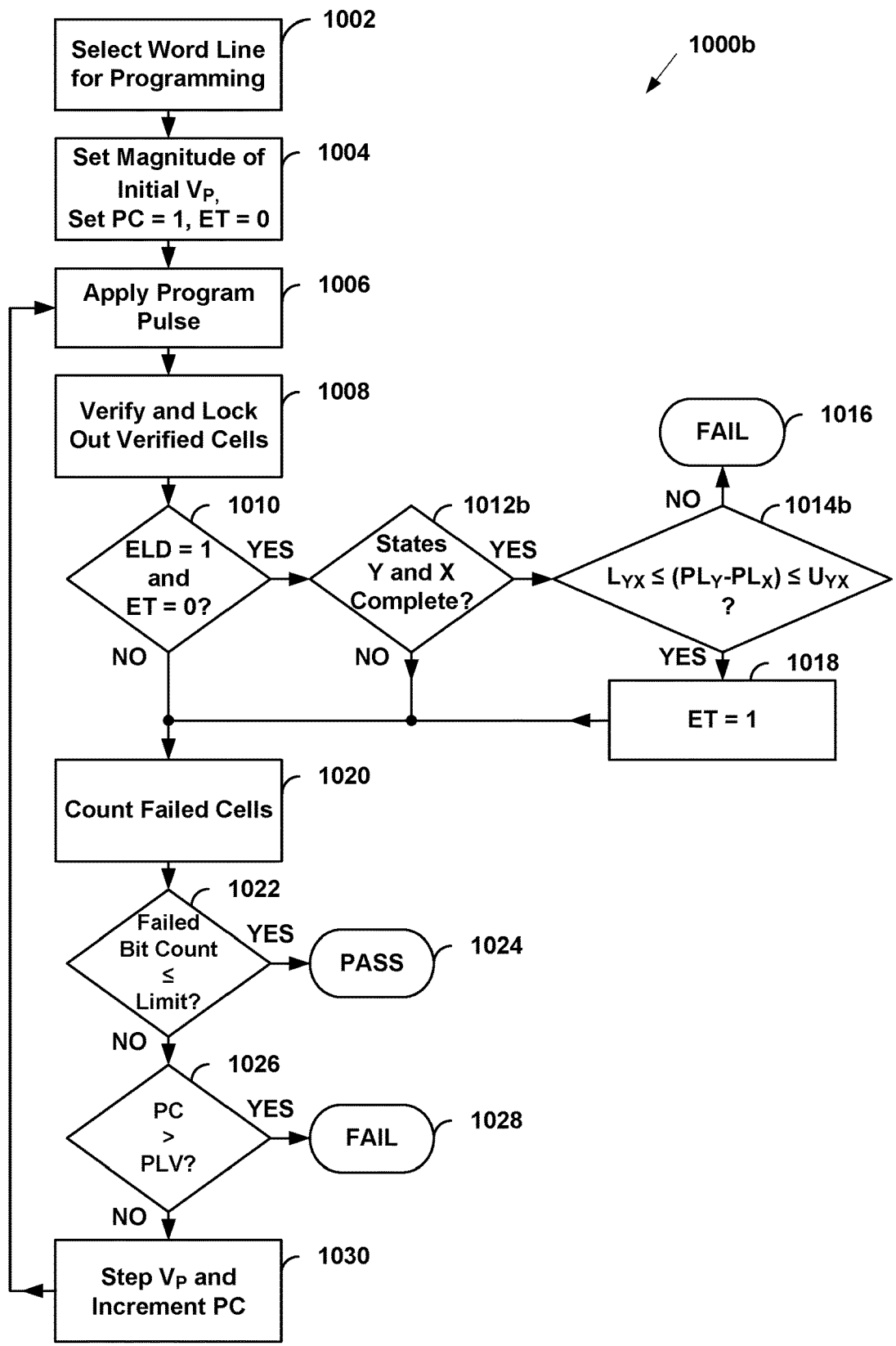
FIG. 10B is a flowchart describing an embodiment of a process for programming non-volatile memory.

FIG. 10B is a flowchart describing an embodiment of a process 1000b for programming memory cells. In an example embodiment, process 1000b is performed on memory die 106 (FIG. 1) using the Control Circuit discussed above. For example, process 1000b can be performed at the direction of state machine 216 (FIG. 2). Process 1000b also can be used to implement the full sequence programming discussed above. Additionally, process 1000b can be used to implement each phase of a multi-phase programming process.

At step 1002, a word line is selected for programming. In an embodiment, the selected word line is coupled to one or more memory cells. In an embodiment, each memory cell coupled to the selected word line is in an erased state prior to programming. In an embodiment, during programming each memory cell coupled to the selected word line will be left in the erased state or programmed to one of multiple programmed states, such as the programmed states depicted in FIGS. 5A-5C.

In step 1004, a programming voltage ($V_P$) is initialized to a starting program voltage $V_{Pinit}$ (e.g., between about 12V to about 16V, or some other value) and a program counter PC maintained by state machine 216 is initialized at 1. In a addition, early tested flag ET is initialized to 0. As described in more detail below, early tested flag ET=0 indicates that an early loop detection test has not yet been performed, and early tested flag ET=1 indicates that an early loop detection test has been performed and has passed.

In step 1006, a program pulse having a magnitude $V_P$ is applied to the selected word line. In an embodiment, the group of memory cells being concurrently programmed are all connected to the selected word line. If a memory cell is to be programmed, then the corresponding bit line coupled to the memory cell is grounded.

If a memory cell should remain at its current threshold voltage, then the corresponding bit line coupled to the memory cell is connected to Vdd to inhibit programming. In an embodiment, the unselected word lines receive one or more boosting voltages (e.g., between about 7V to about 11V, or some other value) to perform boosting schemes known in the art.

In step 1006, the program pulse is applied to all memory cells connected to the selected word line so that all of the connected memory cells are programmed concurrently. That is, they are programmed at the same time or during overlapping times (both of which are considered concurrent). In this manner all memory cells connected to the selected word line will concurrently have their threshold voltage change, unless they have been locked out from programming.

In step 1008, the memory cells are verified using the appropriate set of verify reference voltages to perform one or more verify operations. In an embodiment, the verification process is performed by testing whether the threshold voltages of the memory cells selected for programming have reached the appropriate verify reference voltage.

At step 1010, a determination is made whether early loop detection flag ELD=1 and if early tested flag ET=0. As described above, at step 1004 early tested flag ET is initialized to 0. As also described above, if ELD=1 the early loop detection technique should be used to detect block failure. Thus, on the first pass through step 1010, if the early loop detection technique should be used to detect block failure, ELD=1 and ET=0, and process 1000b proceeds to step 1012b.

At step 1012b, a determination is made whether programming has completed for a particular first programmed state Y (e.g., X=S7 of FIG. 5B) and a particular second programmed state X (e.g., X=S1 of FIG. 5B). If a determination is made at step 1012b that programming for first programmed state Y and second programmed state X has completed, then at step 1014b a determination is made whether the difference in program loop counts ($PL_Y$–$PL_X$) is greater than or equal to corresponding differential lower limit $L_{YX}$ and less than or equal to corresponding differential upper limit $U_{YX}$. The test at step 1014b is an example of an differential program loop count test.

If at step 1014b a determination is made that the difference in program loop counts ($PL_Y$–$PL_X$) is not greater than or equal to corresponding differential lower limit $L_{YX}$ and less than or equal to corresponding differential upper limit $U_{YX}$, then the differential program loop count test is considered to have failed and a status of FAIL is reported in step 1016.

In an embodiment, upon receiving the FAIL status reported at step 1016, the Control Circuit determines that programming the memory cells coupled to the word line has failed. In an embodiment, upon receiving the FAIL status reported at step 1016, the Control Circuit determines that the word line has failed. In another embodiment, upon receiving the FAIL status reported at step 1016, the Control Circuit determines that the entire block of memory cells that includes the memory cells coupled to the word line has failed.

In contrast, if at step 1014b a determination is made that the difference in program loop counts ($PL_Y$–$PL_X$) is greater than or equal to corresponding differential lower limit $L_{YX}$ and less than or equal to corresponding differential upper limit $U_{YX}$, then the differential program loop count test is considered to have passed. At step 1018 early tested flag is set to ET=1 to indicate that the early loop detection test has been performed and has passed, and process 1000b proceeds to step 1020.

In addition, if at step 1012b a determination is made that programming has not completed for the particular first programmed state Y and the particular second programmed state X, the differential program loop count test at step 1014b should not be performed because such testing is premature. Accordingly, process 1000b proceeds to step 1020. Likewise, if at step 1010 a determination is made that early loop detection flag ELD 1 (indicating that the early loop detection test should not be used) or if early tested flag ET 0 (indicating that the early loop detection test has been performed and has passed), then the differential program loop count test at step 1014b should not be performed. Accordingly, in both instances process 1000b proceeds to step 1020.

In step 1020, the memory system counts the number of memory cells that have not yet reached their respective target threshold voltage distribution. That is, the system counts the number of memory cells that have so far failed the verify process. This counting can be done by state machine 216 (FIG. 2), controller 104 (FIG. 1), or other logic.

In an embodiment, each of sense blocks 212 (FIG. 2) stores the status (pass/fail) of their respective memory cells. In an embodiment, one total count reflects the total number of memory cells currently being programmed that have failed the last verify step. In another embodiment, separate counts are kept for each data state.

In step 1022, a determination is made whether the count from step 1020 is less than or equal to a predetermined limit. In an embodiment, the predetermined limit is the number of bits that can be corrected by ECC during a read process for the page of memory cells. If the number of failed cells is less than or equal to the predetermined limit, than the programming process can stop and a status of "PASS" is reported in step 1024. In this situation, enough memory cells programmed correctly such that the few remaining memory cells that have not been completely programmed can be corrected using ECC during the read process.

In some embodiments, the predetermined limit used in step 1022 is below the number of bits that can be corrected by ECC during a read process to allow for future/additional errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, the limit changes based on the number of errors already counted for the page, the number of program-erase cycles performed or other criteria.

If the number of failed memory cells is not less than the predetermined limit, then the programming process continues at step 1026 and the program counter PC is checked against program limit value. An example program limit value is PLV=28 although other values can be used. If the program counter PC is greater than or equal to program limit value PLV, then the program process is considered to have failed and a status of FAIL is reported in step 1028.

If the program counter PC is not greater than or equal to program limit value PLV, then the process continues at step 1030 in which the Program Counter PC is incremented by 1 and program voltage $V_P$ is stepped up to the next magnitude. For example, the next program pulse will have a magnitude greater than the previous pulse by a program step size $\Delta V_P$ (e.g., a step size of between about 0.1V to about 1.0V, or some other value).

Process 1000b loops back to step 1006 and another program pulse is applied to the selected word line so that another iteration (steps 1006-1030) of programming process 1000b is performed.

The example programming processes 1000a and 1000b of FIGS. 10A and 10B, respectively, each perform a single early loop detection test. In particular, process 1000a performs a single absolute program loop count test in steps 1012a-1018 of FIG. 10A, and process 1000b performs a single differential program loop count test in steps 1012b-1018 of FIG. 10B. In other embodiments, program processes may perform more than one absolute program loop count test and/or more than one differential program loop count test to detect program failure, word line failure and/or block failure.

For example, in another exemplary embodiment, a programming process may include an early loop detection test that includes a first absolute program loop count test for first programmed state memory cells (e.g., programmed state S1 in FIG. 5B), a second absolute program loop count test for second programmed state memory cells (e.g., programmed state S4 in FIG. 5B), and a third absolute program loop count test for third programmed state memory cells (e.g., programmed state S6 in FIG. 5B).

The programming process may determine that a program failure, word line failure and/or block failure has occurred if any one of the three early loop detection tests fail, if a majority of the three early loop detection tests fail, or if all three early loop detection tests fail. Alternatively, the results of the three early loop detection tests may be weighted, such that one of the three early loop detection tests is given a higher weight in determining whether a program failure, word line failure and/or block failure has occurred.

In another exemplary embodiment, a programming process may include an early loop detection test that includes an absolute program loop count test for first programmed state memory cells (e.g., programmed state S1 in FIG. 5B), and a differential program loop count test for second programmed state memory cells (e.g., programmed state S4 in FIG. 5B) and third programmed state memory cells (e.g., programmed state S6 in FIG. 5B).

The programming process may determine that a program failure, word line failure and/or block failure has occurred if either the absolute program loop count test or the differential program loop count test has failed, or of both the absolute program loop count test and the differential program loop count test have failed. Alternatively, the results of the two early loop detection tests may be weighted, such that one of the early loop detection tests is given a higher weight in determining whether a program failure, word line failure and/or block failure has occurred.

One embodiment includes an apparatus that includes a block including a word line coupled to a plurality of memory cells, and a control circuit coupled to the word line. The control circuit is configured to program the plurality of memory cells by applying program pulses to the word line in a plurality of program loops, determining a first count of a number of the program loops used to complete programming a first subset of the plurality of memory cells to a first programmed state, first comparing the first count to a corresponding first lower limit and a corresponding first upper limit, and determining whether programming the plurality of memory cells has failed based on a result of the first comparing step.

One embodiment includes an apparatus that includes a block including a word line coupled to a plurality of memory cells, and a control circuit coupled to the word line. The control circuit is configured to program the plurality of memory cells by applying program pulses to the word line in a plurality of program loops, determining a first count of a number of the program loops used to complete programming a first subset of the plurality of memory cells to a first programmed state, determining a second count of a number of the program loops used to complete programming a second subset of the plurality of memory cells to a second programmed state, comparing a difference between the second count and the first count to a corresponding differential lower limit and a corresponding differential upper limit, and determining whether programming the plurality of memory cells has failed based on a result of the comparing step.

One embodiment includes a method that includes programming a plurality of memory cells coupled to a word line by applying program pulses to the word line in a plurality of program loops, determining a first count of a number of the program loops used to complete programming a first subset of the plurality of memory cells to a first programmed state, determining a second count of a number of the program loops used to complete programming a second subset of the plurality of memory cells to a second programmed state, comparing a difference between the second count and the first count to a corresponding differential lower and a corresponding differential upper limit, determining that a maximum number of program loops have not been performed, and determining from a result of the comparing step that programming the plurality of memory cells has failed.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. An apparatus comprising:
a block comprising a word line coupled to a plurality of memory cells; and
a control circuit coupled to the word line, the control circuit configured to program the plurality of memory cells by:
applying program pulses to the word line in a plurality of program loops;
determining a first count of a number of the program loops used to complete programming a first subset of the plurality of memory cells to a first programmed state;
first comparing the first count to a corresponding first lower limit and a corresponding first upper limit;
determining whether programming the plurality of memory cells has failed based on a result of the first comparing step; and
determining that programming the plurality of memory cells has failed if the first count is less than the corresponding first lower limit or greater than the corresponding first upper limit.

2. The apparatus of claim 1, wherein the control circuit is further configured to:
determine that the first count is less than the corresponding first lower limit; and
determine that programming the plurality of memory cells has failed.

3. The apparatus of claim 1, wherein the control circuit is further configured to:
determine that the first count is greater than the corresponding first upper limit; and
determine that programming the plurality of memory cells has failed.

4. The apparatus of claim 1, wherein the control circuit is further configured to:
determine that the first count is greater than or equal to the corresponding first lower limit and less than or equal to the corresponding first upper limit; and
determine that programming the plurality of memory cells has passed.

5. The apparatus of claim 1, wherein the control circuit is further configured to:
determine that the first count is less than the corresponding first lower limit; and
determine from the result of the first comparing step that the block has failed.

6. The apparatus of claim 1, wherein the control circuit is further configured to:
determine that the first count is greater than the corresponding first upper limit; and determine from the result of the first comparing step that the block has failed.

7. The apparatus of claim 1, wherein the control circuit is further configured to:
   determine that the first count is greater than or equal to the corresponding first lower limit and less than or equal to the corresponding first upper limit;
   determine that a maximum number of program loops has been performed; and
   determine that programming the plurality of memory cells has failed,
   wherein the maximum number of program loops is greater than the corresponding first upper limit.

8. The apparatus of claim 1, wherein the control circuit is further configured to program the plurality of memory cells by:
   determining a second count of a number of the program loops used to complete programming a second subset of the plurality of memory cells to a second programmed state;
   second comparing the second count to a corresponding second lower limit and a corresponding second upper limit; and
   determining whether programming the plurality of memory cells has failed based on a result of the second comparing step.

9. The apparatus of claim 8, wherein the control circuit is further configured to determine whether programming the plurality of memory cells has failed based on the results of the first comparing step and the second comparing step.

10. The apparatus of claim 8, wherein the control circuit is further configured to determine that programming the plurality of memory cells has failed if at least one of the following is true:
    the first count is less than the corresponding first lower limit;
    the first count is greater than the corresponding first upper limit;
    the second count is less than the corresponding second lower limit; and
    the second count is greater than the corresponding second upper limit.

11. The apparatus of claim 8, wherein the control circuit is further configured to determine that programming the plurality of memory cells has failed if all of the following are true:
    the first count is less than the corresponding first lower limit;
    the first count is greater than the corresponding first upper limit;
    the second count is less than the corresponding second lower limit; and
    the second count is greater than the corresponding second upper limit.

12. An apparatus comprising:
    a block comprising a word line coupled to a plurality of memory cells; and
    a control circuit coupled to the word line, the control circuit configured to program the plurality of memory cells by:
        applying program pulses to the word line in a plurality of program loops;
        determining a first count of a number of the program loops used to complete programming a first subset of the plurality of memory cells to a first programmed state;
        determining a second count of a number of the program loops used to complete programming a second subset of the plurality of memory cells to a second programmed state;
        comparing a difference between the second count and the first count to a corresponding differential lower limit and a corresponding differential upper limit; and
        determining whether programming the plurality of memory cells has failed based on a result of the comparing step.

13. The apparatus of claim 12, wherein the control circuit is further configured to program the plurality of memory cells by:
    determining that the difference between the second count and the first count is less than the corresponding differential lower limit; and
    determining that programming the plurality of memory cells has failed.

14. The apparatus of claim 12, wherein the control circuit is further configured to program the plurality of memory cells by:
    determining that the difference between the second count and the first count is greater than the corresponding differential upper limit; and
    determining that programming the plurality of memory cells has failed.

15. The apparatus of claim 12, wherein the control circuit is further configured to program the plurality of memory cells by:
    determining that the difference between the second count and the first count is greater than or equal to the corresponding differential lower limit and less than or equal to the corresponding differential upper limit; and
    determining that programming the plurality of memory cells has passed.

16. The apparatus of claim 12, wherein the control circuit is further configured to program the plurality of memory cells by:
    determining that the difference between the second count and the first count is less than the corresponding differential lower limit; and
    determining from the result of the comparing step that the block has failed.

17. The apparatus of claim 12, wherein the control circuit is further configured to program the plurality of memory cells by:
    determining that the difference between the second count and the first count is greater than the corresponding differential upper limit; and
    determining from the result of the comparing step that the block has failed.

18. The apparatus of claim 12, wherein the control circuit is further configured to determine that programming the plurality of memory cells has failed if any one of the following is true:
    the first count is less than a corresponding lower limit;
    the first count is greater than a corresponding upper limit;
    the difference between the second count and the first count is less than the corresponding differential lower limit; and
    the difference between the second count and the first count is greater than the corresponding differential upper limit.

19. A method comprising:
    programming a plurality of memory cells coupled to a word line by:

applying program pulses to the word line in a plurality of program loops;

determining a first count of a number of the program loops used to complete programming a first subset of the plurality of memory cells to a first programmed state;

determining a second count of a number of the program loops used to complete programming a second subset of the plurality of memory cells to a second programmed state;

comparing a difference between the second count and the first count to a corresponding differential lower and a corresponding differential upper limit;

determining that a maximum number of program loops have not been performed; and determining from a result of the comparing step that programming the plurality of memory cells has failed.

20. The method of claim 19, further comprising determining from the result of the comparing step that the block has failed.

\* \* \* \* \*